United States Patent
Kurita et al.

(10) Patent No.: US 7,763,985 B2
(45) Date of Patent: Jul. 27, 2010

(54) FLIP-CHIP TYPE SEMICONDUCTOR DEVICE

(75) Inventors: Yoichiro Kurita, Kawasaki (JP); Rieka Ouchi, Kawasaki (JP); Takashi Miyazaki, Kawasaki (JP); Toshiyuki Yamada, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/257,689

(22) Filed: Oct. 24, 2008

(65) Prior Publication Data

US 2009/0051029 A1    Feb. 26, 2009

Related U.S. Application Data

(62) Division of application No. 11/798,224, filed on May 11, 2007, now Pat. No. 7,554,205, which is a division of application No. 10/919,411, filed on Aug. 17, 2004, now Pat. No. 7,238,548.

(30) Foreign Application Priority Data

Aug. 19, 2003   (JP) ............... 2003-295067

(51) Int. Cl.
*H01L 23/48* (2006.01)
(52) U.S. Cl. ............... 257/778; 257/789; 257/E23.121
(58) Field of Classification Search ............... 257/778, 257/787, 788, E23.116, E23.121, 789
See application file for complete search history.

(56) References Cited

U.S. PATENT DOCUMENTS

| 5,492,863 | A | | 2/1996 | Higgins |
| 5,672,400 | A | * | 9/1997 | Hansen et al. ............ 428/40.1 |
| 5,773,896 | A | * | 6/1998 | Fujimoto et al. ............ 257/777 |
| 5,930,599 | A | | 7/1999 | Fujimoto et al. |
| 5,981,313 | A | | 11/1999 | Tanaka |
| 6,049,038 | A | | 4/2000 | Suzuki |
| 6,350,664 | B1 | | 2/2002 | Haji et al. |
| 6,780,682 | B2 | | 8/2004 | Pendse |
| 6,798,072 | B2 | | 9/2004 | Kajiwara et al. |
| 6,833,180 | B1 | * | 12/2004 | Kodemura ............ 428/220 |
| 6,838,316 | B2 | | 1/2005 | Lizuka et al. |
| 6,897,923 | B2 | * | 5/2005 | Kanesaka et al. ........... 349/113 |
| 2002/0197770 | A1 | | 12/2002 | Irie |

FOREIGN PATENT DOCUMENTS

| JP | 03-012942 | 1/1991 |
| JP | 11 274241 | 10/1999 |
| JP | 11 297750 | 10/1999 |
| JP | 11-307586 | 11/1999 |

(Continued)

OTHER PUBLICATIONS

Chinese Patent Office issued a Chinese Office Action dated Mar. 31, 2010, Application No. 200810161058.9.

*Primary Examiner*—Tuan N. Quach
(74) *Attorney, Agent, or Firm*—Young & Thompson

(57) ABSTRACT

A flip-chip type semiconductor device includes a semiconductor substrate. A plurality of electrode terminals are provided and arranged on a top surface of the semiconductor substrate, a sealing resin layer is formed on the top surface of the semiconductor substrate such that the electrode terminals are completely covered with the sealing resin layer.

8 Claims, 15 Drawing Sheets

FOREIGN PATENT DOCUMENTS

| | | |
|---|---|---|
| JP | 2000-252320 | 9/2000 |
| JP | 2001 176898 | 6/2001 |
| JP | 2002-100730 | 4/2002 |
| JP | 2002-280401 | 9/2002 |
| JP | 2003-168700 | 6/2003 |

* cited by examiner

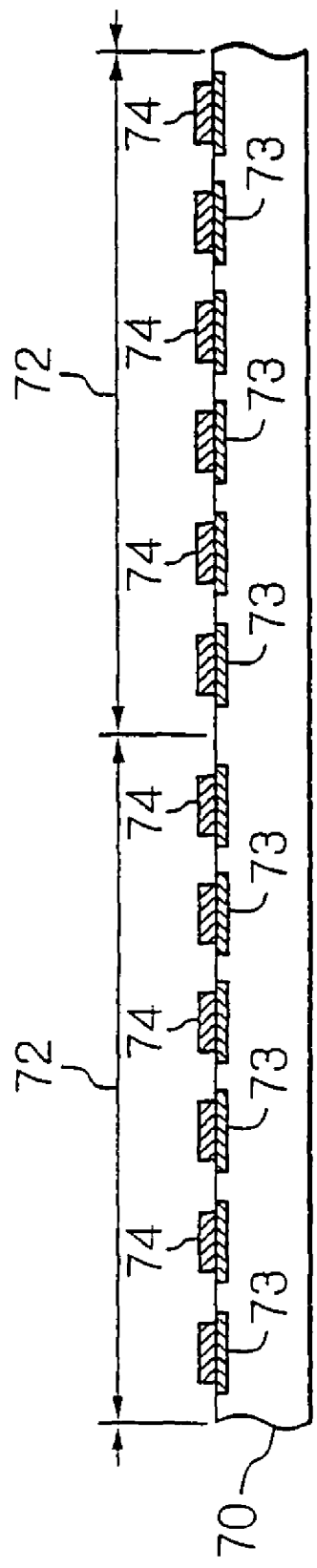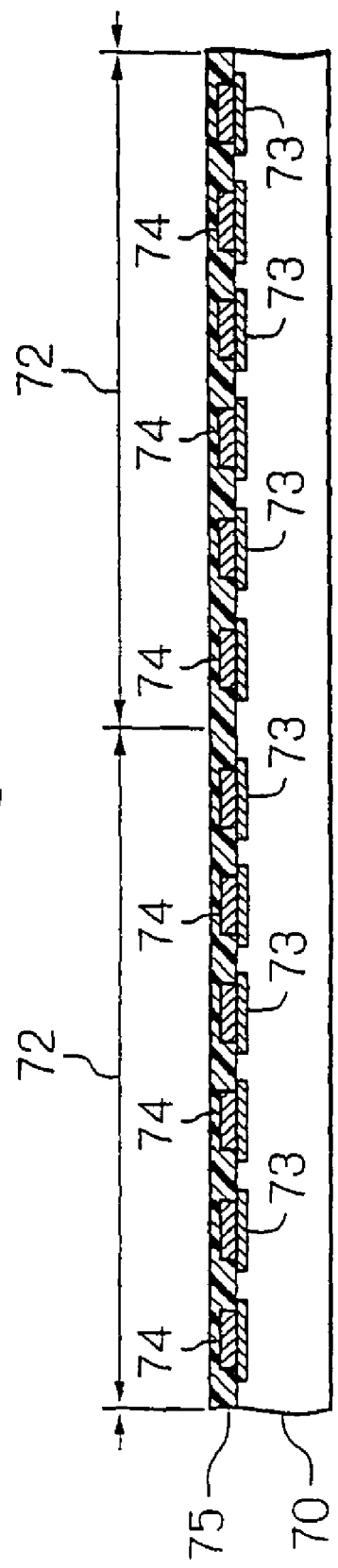

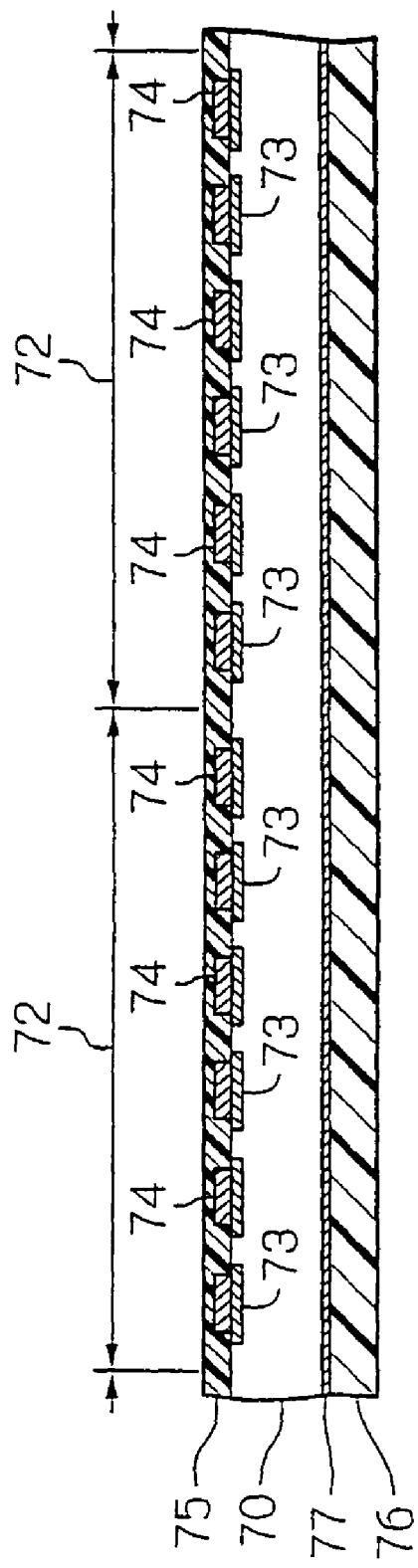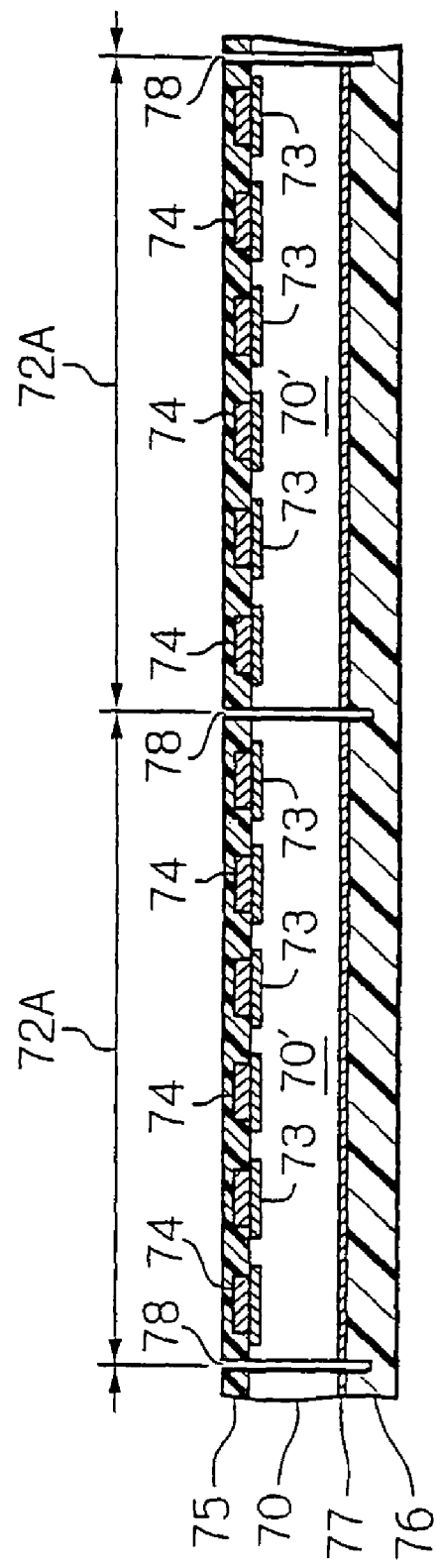

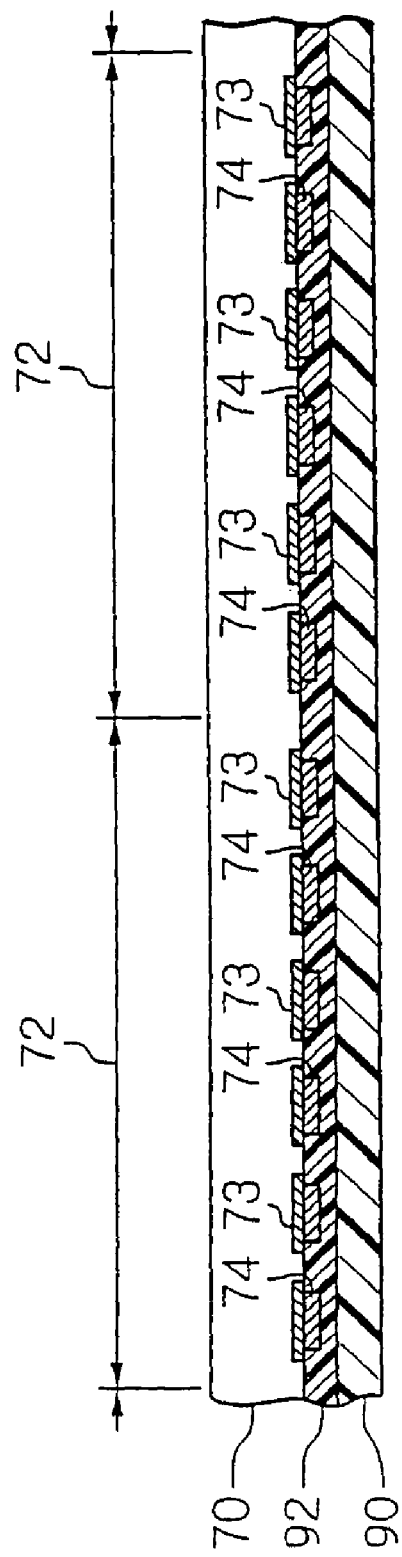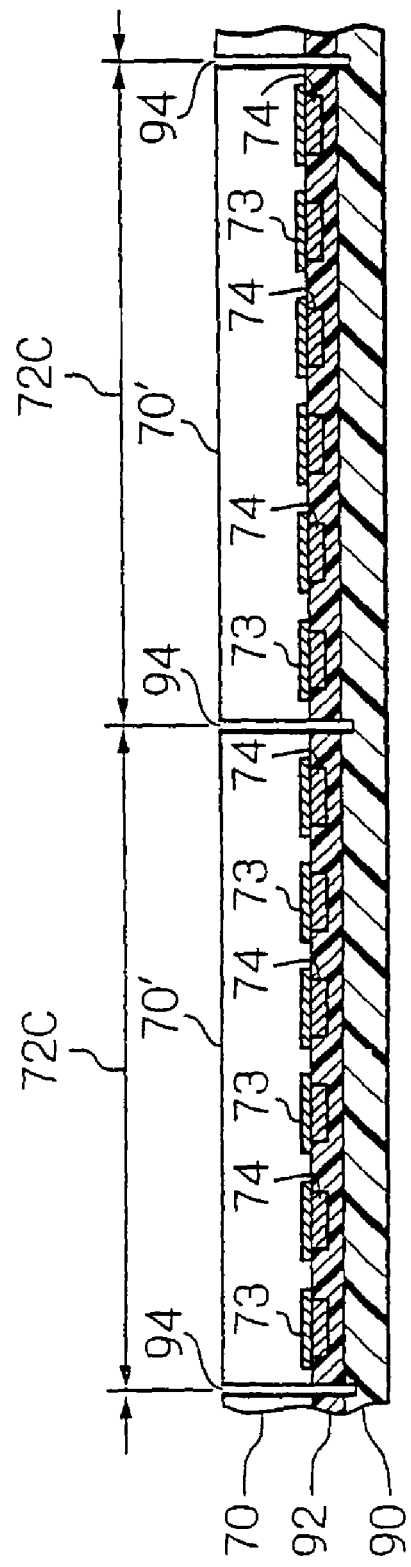

FLIP-CHIP TYPE SEMICONDUCTOR DEVICE

This application is a divisional of application Ser. No. 11/798,224 filed May 11, 2007, U.S. Pat. No. 7,554,205, which is a divisional of application Ser. No. 10/919,411, filed Aug. 17, 2004, U.S. Pat. No. 7,238,548.

This application claims the priority benefit under 35 U.S.C. §119 to Japanese Patent Application No. JP2003-295067 filed on Aug. 19, 2003, which disclosure is hereby incorporated in its entirety by reference.

BACKGROUND OF THE INVENTION

1. Field of the Invention

The present invention relates to a flip-chip type semiconductor device, which is used for manufacturing an electronic product, such as a compact semiconductor package, a motherboard or the like. Also, the present invention relates to a production process for manufacturing such a flip-chip type semiconductor device. Further, the present invention relates to a production process for manufacturing an electronic product, such as a compact semiconductor package, a motherboard or the like, using the flip-chip type semiconductor device.

2. Description of the Related Art

In a representative conventional production method for manufacturing flip-chip type semiconductor devices, for example, a silicon wafer is prepared, and a surface of the silicon wafer is sectioned into a plurality of semiconductor chip areas by forming grid-like fine grooves (i.e. scribe lines) in the silicon wafer. Then, the silicon wafer is processed by various well-known methods such that each of the semiconductor chip areas is produced as a semiconductor chip or device. Subsequently, a plurality of conductive pads are formed and arranged on each of the semiconductor devices, and respective metal bumps may be bonded on the conductive pads, if necessary. Each of the metal bumps may be formed of solder or gold, and serves as an electrode terminal or lead. Thereafter, the silicon wafer is subjected to a dicing process in which the silicon wafer is cut along the grid-like grooves defining the semiconductor devices, so that the semiconductor devices are separated from each other.

The flip-chip type semiconductor device has been developed to meet the demands of higher performance, smaller and lighter size, and higher speed for a piece of electronic equipment. For example, the flip-chip type semiconductor device may be used to manufacture a compact semiconductor package, such as such as a BGA (ball grid array) type semiconductor package, a chip-on-chip type semiconductor package or the like.

In production of the BGA type semiconductor package, a wiring-board, usually called a package board or interposer, is prepared. The wiring board or interposer has a plurality of conductive pads arranged on a top surface thereof, and there is a mirror image relationship between the arrangement of the conductive pads of the interposer and the arrangement of the metal bumps of the flip-chip type semiconductor device. The interposer also has a plurality of conductive pads arranged on a bottom surface thereof, and a plurality of solder balls bonded to the conductive pads, with the solder balls forming the ball grid array (BGA). The flip-chip type semiconductor device is flipped over and mounted on the top surface of the interposer such that the metal bumps of the flip-chip type semiconductor device are bonded to the conductive pads on the top surface of the interposer to thereby establish electrical connections therebetween.

In production of the chip-on-chip semiconductor package, a semiconductor device, featuring a larger size than that of the flip-chip type semiconductor device, is prepared. The larger semiconductor device has a plurality of conductive pads arranged on a top surface thereof, and there is a mirror image relationship between the arrangement of the conductive pads of the larger semiconductor device and the arrangement of the metal bumps of the flip-chip type semiconductor device. The flip-chip type semiconductor device is flipped over and mounted on the top surface of the larger semiconductor device such that the metal bumps of the flip-chip type semiconductor device are bonded to the conductive pads of the larger semiconductor device to thereby establish electrical connections therebetween.

Further, the flip-chip type semiconductor device may be directly mounted on a motherboard for a piece of electronic equipment, such that the respective metal bumps of the flip-chip type semiconductor device are contacted with and bonded to conductive pads formed and arranged on the motherboard.

In any case, after the mounting of the flip-chip type semiconductor device, a resin-underfilling process must be carried out such that the space between the flip-chip type semiconductor device and the interposer, semiconductor device or motherboard is filled with a suitable resin, to thereby seal the arrangements of the metal bumps and conductive pads.

Conventionally, various resin-underfilling processes have been proposed, but it is very difficult to efficiently carry out the conventional resin-underfilling processes, as discussed in detail hereinafter, resulting in decline in productivity of the electronic products using the flip-chip type semiconductor devices. Also, in a recent tendency toward further miniaturizing the flip-chip type semiconductor devices, it is substantially impossible to efficiently carry out the conventional resin-underfilling processes.

SUMMARY OF THE INVENTION

Therefore, a main object of the present invention is to provide a flip-chip type semiconductor device which is constituted such that a resin-underfilling process can be substantially omitted after a mounting of the flip-chip type semiconductor device, resulting in an increase in productivity of electronic products using the flip-chip type semiconductor device.

Another object of the present invention is provide a production process for manufacturing such a flip-chip type semiconductor device.

Yet another object of the present invention is to provide a production process for manufacturing an electronic product, such as a chip-on-chip semiconductor package, a ball gate array semiconductor package, a motherboard or the like, including such a flip-chip type semiconductor device.

In accordance with a first aspect of the present invention, there is provided a flip-chip type semiconductor device comprising: a semiconductor substrate; a plurality of electrode terminals provided and arranged on a top surface of the semiconductor substrate; and a sealing resin layer formed on the top surface of the semiconductor substrate such that the electrode terminals are completely covered with the sealing resin layer.

The flip-chip type semiconductor device may further comprise a protective layer formed on the top surface of the semiconductor substrate such that the electrode terminals are exposed to an outside, with the protective layer being completely covered with the sealing resin layer.

In the flip-chip type semiconductor device, each of the electrode terminals may be formed as a conductive pad formed on the top surface of the semiconductor substrate. Alternatively, each of the electrode terminals may further include a metal bump bonded on the conductive pad. Preferably, the metal bump is formed as a stud-like metal bump.

Also, preferably, the sealing resin layer contains a filler comprising a plurality of solid particles, which may be electrically conductive.

In accordance with a second aspect of the present invention, there is provided a production process comprising the steps of: preparing a semiconductor wafer having a plurality of semiconductor devices produced in a top surface thereof, each of the semiconductor devices having a plurality of electrode terminals provided and arranged on a top surface thereof; forming a sealing resin layer on the top surface of the semiconductor wafer such that the electrode pads are completely covered with the sealing resin layer; and dicing the semiconductor wafer such that the semiconductor devices are divided into a plurality of individually-separated semiconductor devices.

In this production process, the semiconductor wafer may include a protective layer formed on the top surface thereof such that the electrode terminals are exposed to the outside, and the protective layer is completely covered with the sealing resin layer.

Also, each of the electrode terminals may be formed as a conductive pad formed on the top surface of each of the semiconductor devices. Alternatively, each of the electrode terminals may further include a metal bump bonded on the conductive pad. Preferably, the metal bump is formed as a stud-like metal bump.

In the production process according to the present invention, the formation of the sealing resin layer may be carried out by the steps of: putting an liquid resin material on the top surface of the semiconductor wafer; and spinning the semiconductor wafer such that the liquid resin material is spread out over the top surface of the semiconductor wafer, resulting in the formation of the sealing resin layer.

Alternatively, the formation of the sealing resin layer may be carried out by the steps of: preparing an adhesive resin sheet; and laminating the adhesive resin sheet on the top surface of the semiconductor wafer, resulting in the formation of the sealing resin layer. The adhesive sheet may have a dicing resin sheet laminated on a surface thereof. In this case, the lamination of the adhesive sheet on the top surface of the semiconductor wafer may be performed by facing down and applying the semiconductor wafer to another surface of the adhesive sheet opposed to the dicing sheet thereof.

The production process according to the present invention may further comprise the steps of: preparing a substrate having a plurality of electrode terminals provided and arranged a top surface thereof, the arrangement of the electrode terminals of the substrate has a mirror image relationship with respect to the arrangement of the electrode terminals of each of the individually-separated semiconductor devices; and mounting one of the individually-separated semiconductor devices on the substrate such that the electrode terminals of the substrate penetrate into the sealing resin layer of the individually-separated semiconductor device, and are bonded to the respective electrode terminals thereof.

In this production process, each of the electrode terminals of the substrate may comprise a conductive pad formed on the top surface thereof, and a sprout-like metal bump bonded thereon, and each of the electrode terminals of the individually-separated semiconductor device may comprise a conductive pad formed on the top surface thereof. In this case, the mounting of the individually-separated semiconductor device on the substrate may comprise the steps of: flipping over and positioning the individually-separated semiconductor device above the substrate such that the respective conductive pads of the individually-separated semiconductor device are aligned with the sprout-like bumps of the substrate; and pressing the individually-separated semiconductor device against the substrate, resulting in the penetration of the sprout-like bumps of the substrate into the sealing resin layer and the bonding of the sprout-like bumps of the substrate to the conductive pads of the individually-separated semiconductor device.

Alternatively, each of the electrode terminals of the substrate may comprise a conductive pad formed on the top surface thereof, and a stud-like metal bump bonded thereon, and each of the electrode terminals of the individually-separated semiconductor device may comprise a conductive pad formed on the top surface thereof, and a stud-like metal bump bonded thereon. In this case, the mounting of the individually-separated semiconductor device on the substrate may comprise the steps of: flipping over and positioning the individually-separated semiconductor device above the substrate such that the respective stud-like metal bumps of the individually-separated semiconductor device are aligned with the stud-like metal bumps of the substrate; and pressing the individually-separated semiconductor device against the substrate, resulting in the penetration of the stud-like bumps of the substrate into the sealing resin layer and the bonding of the stud-like bumps of the substrate to the stud-like bumps of the individually-separated semiconductor device. Also, the sealing resin layer may contain a filler comprising a plurality of solid particles. In this case, a part of the solid particles is pinched and left in the bonding faces between the stud-like metal bumps of the individually-separated semiconductor device and the stud-like metal bumps of the substrate.

In the production process according to the present invention, the substrate may comprise another semiconductor device, resulting in a production of a chip-on-chip semiconductor device. Also, the substrate may comprise an electronic interposer for producing an electronic product. Further, the substrate may comprise a wiring board for producing a piece of electronic equipment.

In the production process according to the present invention, when the aforesaid semiconductor wafer is defined as a first semiconductor wafer, the production process further may further comprise the steps of: preparing a second semiconductor wafer having a plurality of semiconductor devices produced in a top surface thereof, each of the semiconductor devices having a plurality of electrode terminals provided and arranged on a top surface thereof, the arrangement of the electrode terminals of each of the semiconductor devices of the second semiconductor wafer has a mirror image relationship with respect to the arrangement of the electrode terminals of each of the individually-separated semiconductor devices; mounting the respective individually-separated semiconductor devices on the semiconductor devices of the second semiconductor wafer such that the electrode terminals of each of the semiconductor devices of the second semiconductor wafer penetrate into the sealing resin layer, and are bonded to respective electrode terminals of a corresponding individually-separated semiconductor device, resulting in production of a plurality of chip-on-chip semiconductor assemblies; and dicing the second semiconductor wafer such that the chip-on-chip semiconductor assemblies are separated from each other.

In accordance with a third aspect of the present invention, there is provided a semiconductor wafer having a plurality of semiconductor devices produced therein, which comprises: a plurality of electrode terminals provided and arranged on a top surface of each of the semiconductor devices; and a sealing resin layer formed on all the top surfaces of the semiconductor devices such that the electrode terminals are completely covered with the sealing resin layer.

In accordance with a fourth aspect of the present invention, there is provided a production process comprising the steps of: preparing a semiconductor wafer having a plurality of semiconductor devices produced therein, each of the semiconductor devices having plurality of electrode terminals provided and arranged on a top surface thereof; forming a sealing resin layer on the semiconductor wafer such that all the electrode terminals are completely covered with the sealing resin layer.

BRIEF DESCRIPTION OF THE DRAWINGS

The above objects and other objects will be more clearly understood from the description set forth below, with reference to the accompanying drawings, wherein:

FIG. 8A is a partial sectional view of a silicon wafer, for explaining a first representative step of a second embodiment of a production process for manufacturing flip-chip type semiconductor devices according to the present invention;

FIG. 8B is a partial sectional view of the silicon wafer, on which a sealing resin layer is formed, for explaining a second representative step of the second embodiment of the production process for manufacturing the flip-chip type semiconductor devices according to the present invention;

FIG. 8C is a partial sectional view of the silicon wafer, which is mounted on a dicing resin sheet, for explaining a third representative step of the second embodiment of the production process for manufacturing the flip-chip type semiconductor devices according to the present invention;

FIG. 8D is a partial sectional view, similar to FIG. 8C, showing the silicon wafer subjected to a dicing process;

FIG. 11C is a partial sectional view of the silicon wafer, which is faced down and applied to the dicing resin sheet, for explaining a third representative step of the third embodiment of the production process for manufacturing the flip-chip type semiconductor devices according to the present invention;

FIG. 11D is a partial sectional view, similar to FIG. 11C, showing the silicon wafer subjected to a dicing process;

DESCRIPTION OF THE PREFERRED EMBODIMENTS

Before descriptions of embodiments of the present invention, for better understanding of the present invention, a conventional production process for manufacturing a chip-on-chip semiconductor package will be explained with reference to FIGS. 1A to 1D.

Figure 1A:
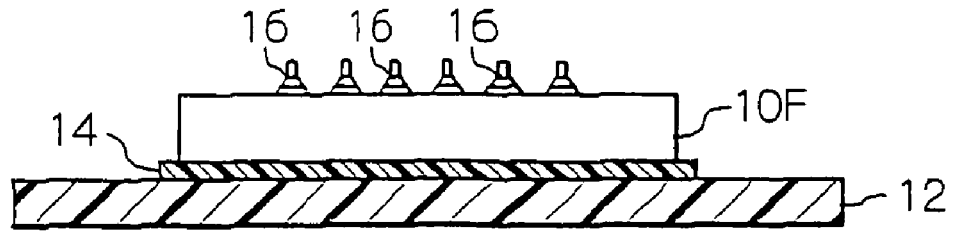
FIG. 1A is a sectional view showing a first representative step of a conventional production process for manufacturing a chip-on-chip semiconductor package.

In this conventional production process, as shown in FIG. 1A, a first semiconductor device 10F is prepared, and then is mounted on and adhered to a substrate 12, using a suitable adhesive agent 14. Although not illustrated, the first semiconductor device 10F has a plurality of conductive pads provided on a top surface thereof, and respective metal bumps 16 bonded on the conductive pads which are arranged at a central area of the top surface thereof. Each of the conductive pads may be formed of a suitable metal material, such as aluminum, gold, copper or the like. Also, each of the metal bumps 16 is formed as a sprout-like gold bump, which may be may be produced from a gold wire, using a well-know wire-bonding machine.

Note, in this example, although the substrate 12 is formed as a wiring board or an interposer, it may comprise a mount stage included in a metal lead frame.

Figure 1B:
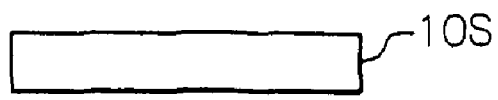
FIG. 1B is a sectional view showing a second representative step of the conventional production process.

On the other hand, as shown in FIG. 1B, a flip-chip type semiconductor device is prepared as a second semiconductor device 10S featuring a smaller size than that of the first semiconductor device 10F. Although not illustrated, the second semiconductor device 10S has a plurality of conductive pads provided on a top surface thereof. Note, the arrangement of the conductive pads of the second semiconductor device 10S has a mirror image relationship with respect to the arrangement of the sprout-like metal bumps 16.

After the preparation of the first and second semiconductor devices 10F and 10S, the second semiconductor device 10S is flipped over and positioned above the first semiconductor device 10F such that the respective conductive pads of the second semiconductor device 10S are aligned with the sprout-like metal bumps 16 provided on the central area of the top surface of the first semiconductor device 10F.

Figure 1C:
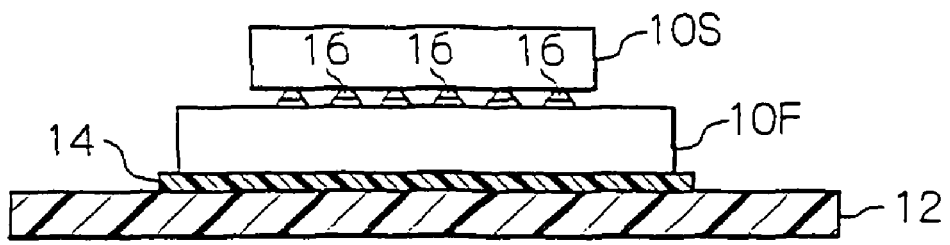
FIG. 1C is a sectional view showing a third representative step of the conventional production process.

Then, as shown in FIG. 1C, the second semiconductor device 10S is pressed against the top surface of the first semiconductor device 10F, using either an ultrasonic-pressure bonding method or a heat-pressure bonding method, so that the respective conductive pads of the second semiconductor device 10S are abutted against and bonded to the sprout-like metal bumps 16 provided on the top surface of the first semiconductor device 10F.

Figure 1D:
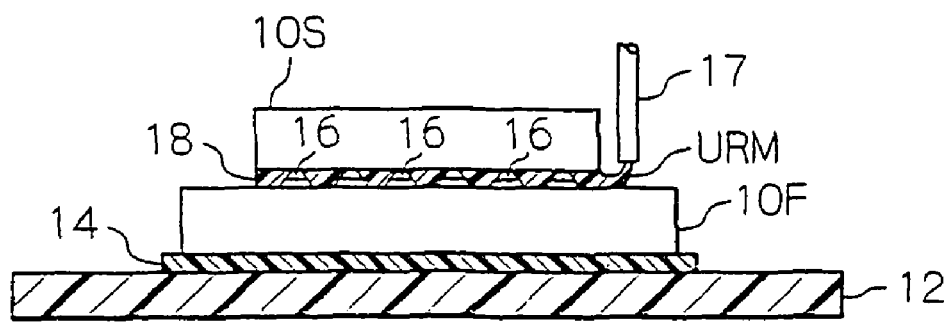
FIG. 1D is a sectional view showing a fourth representative step of the conventional production process.

Subsequently, as shown in FIG. 1D, a resin supply nozzle 17 is moved to a space between the first and second semiconductor devices 10F and 10S, and an uncured liquid resin material, indicated by reference URM, is introduced from the resin supply nozzle 17 into the space by utilizing the capillary phenomenon. Namely, the second semiconductor device 20S is underfilled with the uncured liquid resin material URM so that the sprout-like metal bumps 16 are sealed together with the conductive pads with the liquid resin material URM. Then, the liquid resin material URM is completely hardened as a sealing resin layer 18 between the first and second semiconductor devices 10F and 10S.

Thereafter, each of the conductive pads, which are provided at the peripheral area of the top surface of the first semiconductor device 10F, is electrically connected to a corresponding conductive pad, provided on the interposer 12, with a bonding wire. Then, the assembly shown in FIG. 1D is resin-sealed, using a transfer molding method, resulting in production of the chip-on-chip semiconductor package.

In this conventional production method, an entrance location for introducing the uncured liquid into the space between the first and second semiconductor devices 10F and 10S must be previously determined at the peripheral area of the top surface of the first semiconductor device 10F, and no conductive pads can be provided at the entrance location, resulting in restriction of a freedom of design of the chip-on-chip semiconductor device.

Also, when the flip-chip type semiconductor device is further miniaturized, it is very difficult or impossible to properly fill the space between the first and second semiconductor devices 10F and 10S with the uncured liquid resin material URM, because the space becomes narrower due to the further miniaturization of the flip-chip type semiconductor device.

With reference to FIGS. 2A to 2D, another conventional representative production process for manufacturing a chip-on-chip semiconductor package is illustrated.

Figure 2A:
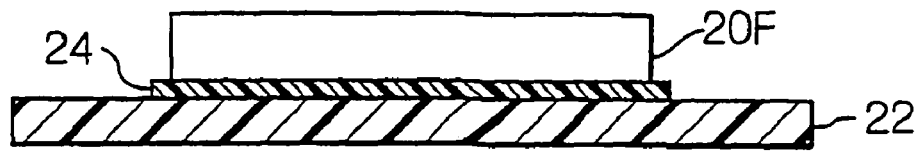
FIG. 2A is a sectional view showing a first representative step of another conventional production process for manufacturing a chip-on-chip semiconductor package.

In this conventional production process, as shown in FIG. 2A, a first semiconductor device 20F is prepared, and then is mounted on and adhered to a substrate 22, using a suitable adhesive agent 24. Although not shown, the first semiconductor device 20F has a plurality of conductive pads provided on top surface thereof, and each of the conductive pads may be formed of a suitable metal material, such as aluminum, gold, copper or the like. Although the substrate 22 is formed as a wiring board or an interposer, it may comprise a mount stage included in a metal lead frame.

Figure 2B:
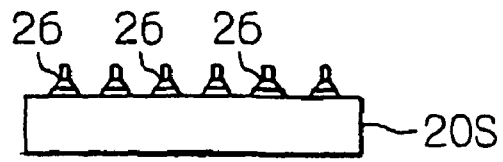
FIG. 2B is a sectional view showing a second representative step of the other conventional production process.

On the other hand, as shown in FIG. 2B, a flip-chip type semiconductor device is prepared as a second semiconductor device 20S featuring a smaller size than that of the first semiconductor device 20F. The second semiconductor device 20S has a plurality of conductive pads (not shown) provided on a top surface thereof, and respective metal bumps 26 bonded on the conductive pads. As illustrated, similar to the above-mentioned bumps 16, each of the metal bumps 26 is formed as a sprout-like gold bump. Note, the arrangement of the sprout-like metal bumps 26 of the second semiconductor device 20S has a mirror image relationship with respect to the arrangement of the conductive pads which is provided at a central area of the top surface of the first semiconductor device 20F.

Figure 2C:
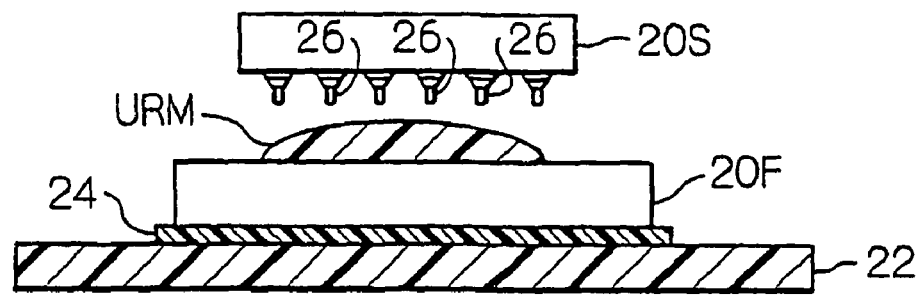
FIG. 2C is a sectional view showing a third representative step of the other conventional production process.

After the preparation of the first and second semiconductor devices 20F and 20S, as shown in FIG. 2C, an uncured liquid resin material, indicated by reference URM, is put on the top surface of the first semiconductor device 20F, using a potting method. Then, the second semiconductor device 20S is flipped over and positioned above the first semiconductor device 20F such that the respective sprout-like metal bumps 26 are aligned with the conductive pads arranged at a central area of the top surface of the first semiconductor device 20F.

Figure 2D:
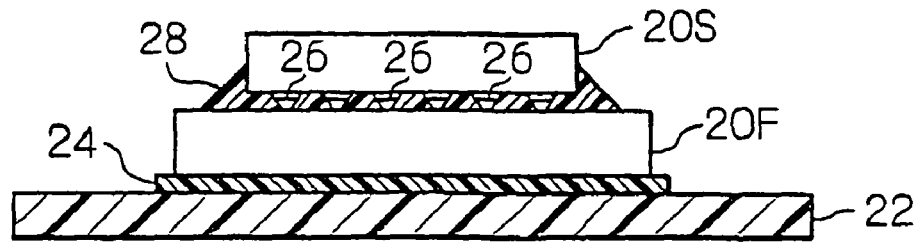
FIG. 2D is a sectional view showing a fourth representative step of the other conventional production process.

Subsequently, as shown in FIG. 2D, the second semiconductor device 20S is pressed against the top surface of the first semiconductor device 20F, using either an ultrasonic-pressure bonding method or a heat-pressure bonding method, so that the respective sprout-like metal bumps 26 are abutted against and bonded to the conductive pads which are provided at the central area of the top surface of the first semiconductor device 20F. At the same time, the sprout-like metal bumps 26 are sealed together with the conductive pads with the uncured liquid resin material URM. Then, the liquid resin material URM is completely hardened as a sealing resin layer 28 (FIG. 2D) between the first and second semiconductor devices 20F and 20S.

Thereafter, similar to the first-mentioned conventional production process, each of the peripheral conductive pads, which are provided at the peripheral area of the top surface of the first semiconductor device 20F, is electrically connected to a corresponding conductive pad (not shown), provided on the interposer 22, with a bonding wire. Then, the assembly shown in FIG. 2D is resin-sealed, using a transfer molding method, resulting in production of the chip-on-chip semiconductor package.

In this other conventional production method, it is very difficult to accurately control an amount of the uncured liquid resin material URM to be put on the top surface of the first semiconductor device 20F using the potting method.

If the amount of uncured liquid resin material URM put on the top surface of the second semiconductor device 20S is too much, a part of the liquid resin material URM is swelled out of a space between the first and second semiconductor devices 20F and 20S, and thus the peripheral conductive pads on the first semiconductor device 20F may be polluted with the swelled-out resin material. If a peripheral conductive pad on the first semiconductor device 10F is polluted with the resin material, it is impossible to properly bond the bonding wire to the polluted conductive pad. Also, if a thickness of the second semiconductor device 20S is too thin, a movable tool, which is used to carry the second semiconductor device 10S, may be polluted with the swell-out resin material. Thus, it is difficult to decrease an entire thickness of the chip-on-chip semiconductor package.

On the other hand, if the amount of uncured liquid resin material URM put on the top surface of the second semiconductor device 10S is too small, voids or cavities may be produced in the sealing resin layer 18.

In the conventional production process shown in FIGS. 2A to 2D, it has been proposed that, for example, a semi-cured sealing resin sheet is substituted for the uncured liquid resin material URM. In particular, the sealing resin sheet is put on the top surface of the first semiconductor device 20F such that the conductive pads provided at the central area of the top surface thereof are covered with the sealing resin sheet. Subsequently, the second semiconductor device 20S is pressed against the sealing resin sheet such that the sprout-like metal bumps penetrate the sealing resin sheet, and is then bonded to the conductive pads on the first semiconductor 20F. Thereafter, the semi-cured sealing resin sheet is completely hardened to thereby form a sealing resin layer between the first and second semiconductor devices 20F and 20S.

Since it is possible to accurately control a thickness of the sealing resin sheet, and therefore, an amount of resin material forming the sealing resin layer, a part of the sealing resin sheet can be prevented from being swelled out of the space between the first and second semiconductor devices 20F and 20S. Nevertheless, it is difficult to exactly and precisely position the sealing resin sheet on the top surface of the first semiconductor device 20F. In reality, the positioning of the sealing resin layer involves an error on the order of 500 microns.

JP-A-(HEI) 11-297750 discloses that a sealing resin layer is previously formed on a surface of a silicon wafer in which a plurality of flip-chip type semiconductor devices are produced, with each of the devices having a plurality of metal bumps provided thereon. The formation of the sealing resin layer is performed, using a transfer molding method, such that tip ends of the metal bumps are projected from the sealing resin layer. Thereafter, the silicon wafer is subjected to a dicing process in which the flip-chip type semiconductor devices are separated from each other. When each of the separated flip-chip type semiconductor device is flipped over and mounted on an interposer or another semiconductor device, the sealing resin layer serves as an underfilling resin layer for sealing the metal bumps and the conductive pads associated therewith.

In the production process disclosed in JP-A-(HEI) 11-297750, although it is possible to accurately control a thickness of the sealing resin layer, the formation process of the sealing resin layer is troublesome, because a flexible resin sheet must be incorporated in a transfer mold die so that the tip ends of the metal bumps can be projected from the sealing resin layer. In particular, a tip end of each of the metal bumps is penetrated into the flexible sheet, and a resin material to be molded is introduced into a space between the top surface of silicon wafer and the flexible resin sheet. In short, it cannot be said that the production process disclosed in JP-A-(HEI) 11-297750 is efficient.

Also, JP-A-(HEI) 11-274241 discloses that a sealing resin layer is previously formed on a surface of a silicon wafer in which a plurality of flip-chip type semiconductor devices are produced, with each of the devices having a plurality of metal bumps provided thereon. The formation of the sealing resin layer is performed so that the metal bumps are completely buried in the sealing resin layer, and then the sealing resin layer is subjected to a polishing process such that the metal bumps are exposed to the outside. Thereafter, the silicon wafer is subjected to a dicing process in which the flip-chip type semiconductor devices are separated from each other. When each of the separated flip-chip type semiconductor device is flipped over and mounted on an interposer or another semiconductor device, the sealing resin layer serves as an underfilling resin layer for sealing the metal bumps and the conductive pads associated therewith.

Also, it cannot be said the production process disclosed in JP-A-(HEI) 11-274241 is efficient, because the polishing process is troublesome.

First Embodiment

With reference to FIG. 3A to 3H, a first embodiment of a production process for manufacturing a plurality of flip-chip type semiconductor devices according to the present invention is explained below.

Figure 3A:
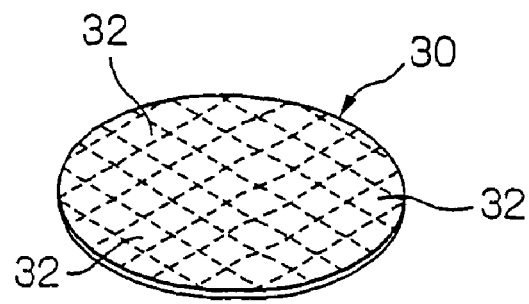
FIG. 3A is a perspective view of a silicon wafer, for explaining a first representative step of a first embodiment of a production process for manufacturing flip-chip type semiconductor devices according to the present invention.

First, as shown in FIG. 3A, a silicon wafer 30 is prepared. A top surface of the silicon wafer 30 is sectioned into a plurality of semiconductor chip areas 32 by forming grid-like fine grooves (i.e. scribe lines), which are represented by broken lines. The silicon wafer 30 is already processed by various well-known methods so that each of the semiconductor chip areas 32 is produced as a semiconductor chip or device.

Figure 3B:
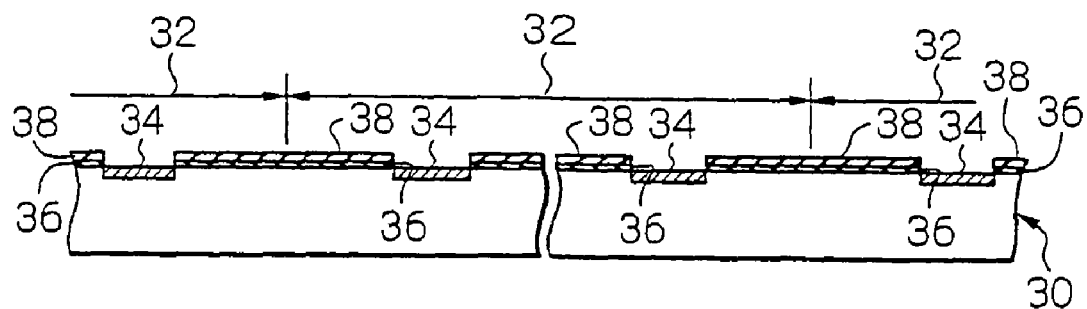
FIG. 3B is a partially-enlarged sectional view of the silicon wafer shown in FIG. 3A.

Also, as shown in FIG. 3B in which an extent of each of the semiconductor devices is indicated by reference 32, a plurality of electrode terminals 34 are already provided and arranged on each of the semiconductor devices 32, and each of the electrode terminals 34 is formed as a conductive pad. Further, a silicon dioxide layer 36 and a passivation layer 38 may be formed on the top surface of the silicon wafer 30 such that each of the electrode terminals or conductive pads 34 is exposed to the outside. Both the silicon dioxide layer 36 and the passivation layer 38 function as a protective layer. An organic protective layer, such as a polyimide layer, may be substituted for both the silicon dioxide layer 36 and the passivation layer 38.

Note, each of the conductive pads 34 is formed of a suitable metal material, such as aluminum, gold, copper or the like. Also, note, in this embodiment, the conductive pads 34 must be arranged at a given pitch of 40 μm or more than 40 μm for the reasons stated in detail hereinafter.

Figure 3C:
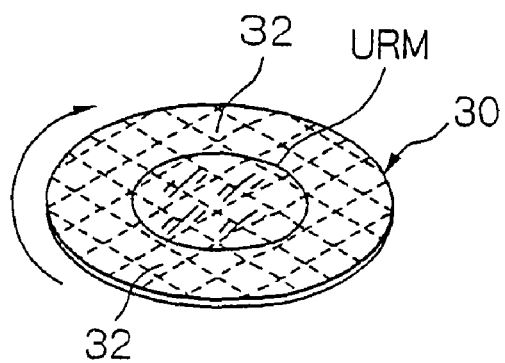
FIG. 3C is a perspective view of the silicon wafer, on which an uncured liquid resin material is put, for explaining a second representative step of the first embodiment of the production process for manufacturing the flip-chip type semiconductor devices according to the present invention.
Figure 3D:
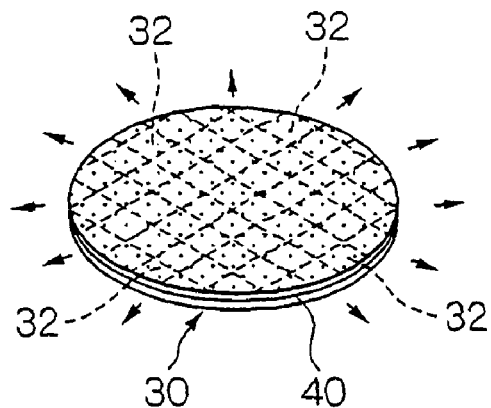
FIG. 3D is a perspective view of the silicon wafer, which is subjected to a spin-coat process, for explaining a second representative step of the first embodiment of the production process for manufacturing the flip-chip type semiconductor devices according to the present invention.

Then, the silicon wafer 30 is subjected to a spin-coat process, as shown FIGS. 3C and 3D. In particular, as shown in FIG. 3C, a given amount of suitable uncured liquid resin material, indicated by reference URM, is put on the top surface of the silicon wafer 30. Subsequently, the silicon wafer 30 is spun as indicated by an arrow in FIG. 3C, and the uncured liquid resin material URM is spread out over the top surface of the silicon wafer 30, due to the centrifugal forces acting on the uncured liquid resin material, as indicated by radial arrows in FIG. 3D.

Figure 3E:
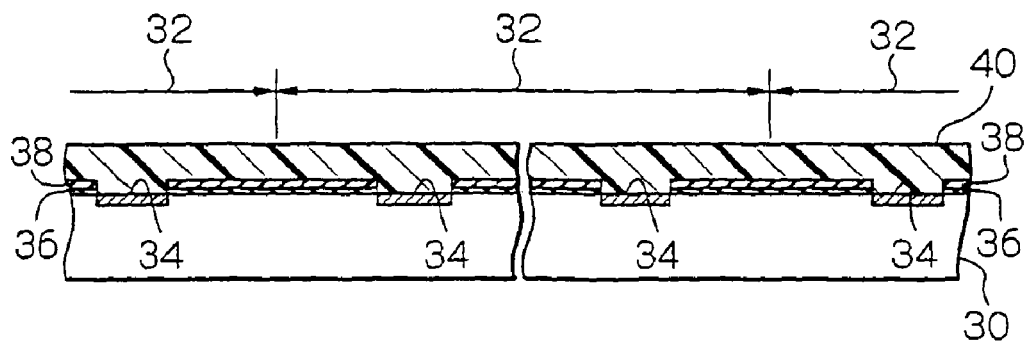
FIG. 3E is a partially-enlarged sectional view of the silicon wafer shown in FIG. 3D.

Thereafter, the spread-out resin material URM is partially hardened to a degree at which the spread-out resin material URM cannot be fluidified. Thus, the partially-hardened resin material URM is formed as a sealing resin layer 40 on the top surface of the silicon wafer 30, such that the conductive pads 34 and the passivation layer 38 are completely covered with the sealing resin layer 40, as shown in FIGS. 3D and 3E.

Figure 3F:
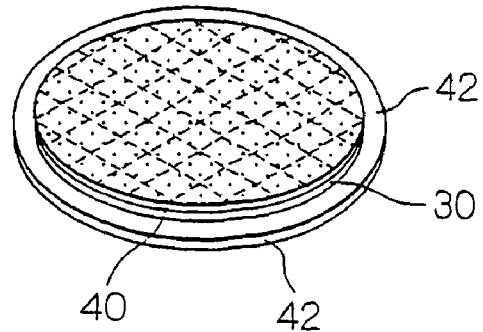
FIG. 3F is a perspective view of the silicon wafer, which is mounted on a dicing resin sheet, for explaining a third representative step of the first embodiment of the production process for manufacturing the flip-chip type semiconductor devices according to the present invention.
Figure 3G:
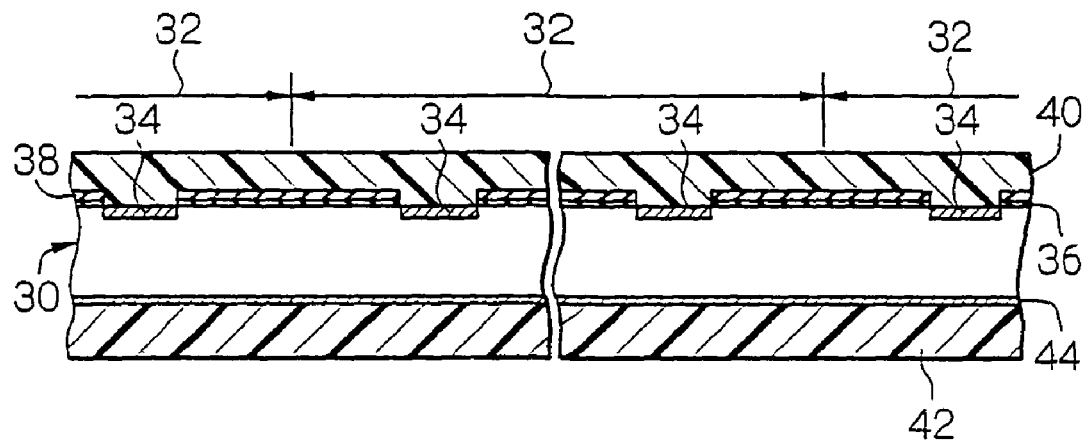
FIG. 3G is a partially-enlarged sectional view of the silicon wafer shown in FIG. 3F.
Figure 3H:
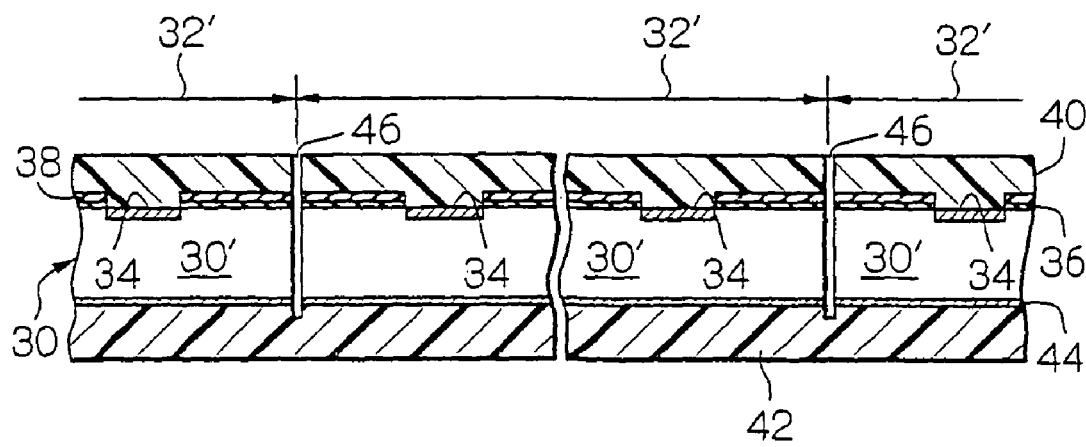
FIG. 3H is a partially-enlarged sectional view, similar to FIG. 3G, showing the silicon wafer subjected to a dicing process.

After the formation of the sealing resin layer 40, as shown in FIGS. 3F and 3G, a dicing resin sheet 42 having an adhesive layer 44 (FIG. 3G) is applied and adhered to a bottom surface of the silicon wafer 30. Then, as shown in FIG. 3H, the silicon wafer 30 is subjected to a dicing process so as to be cut off along the grid-like grooves (not shown), with two cutting grooves being representatively indicated by reference 46 in FIG. 3H. Namely, the silicon wafer 30 is divided into the plurality of flip-chip type semiconductor devices 32', with each of the divided sections of the silicon wafer 30 itself forming a semiconductor substrate 30' for a corresponding flip-chip type semiconductor device 32'.

The processed silicon wafer 30 or the divided semiconductor devices 32' may be shipped and circulated in an electronic market, to manufacture compact semiconductor packages, such as such as BGA (ball grid array) type semiconductor packages, chip-on-chip type semiconductor packages or the like.

In the spin-coat process, it is possible to accurately control a thickness of the sealing resin layer 40, and therefore, an amount of resin material forming the sealing resin layer 40.

Figure 4A:
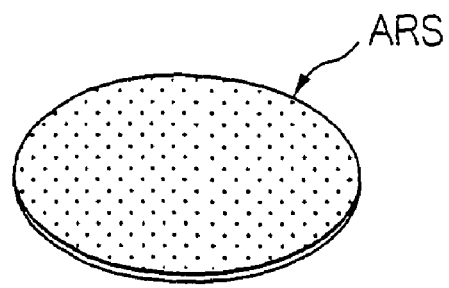
FIG. 4A is a perspective view showing an adhesive resin sheet, for explaining a representative step of a modification of the production process shown in FIGS. 3A to 3H.
Figure 4B:
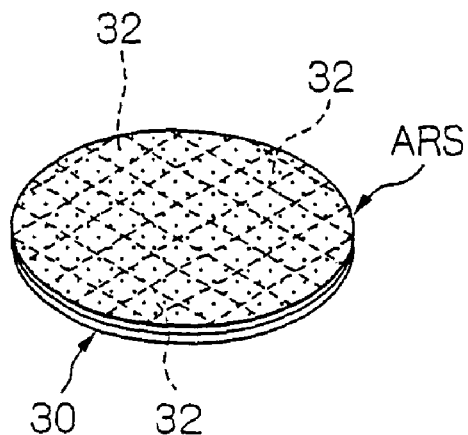
FIG. 4B is a perspective view showing the silicon wafer having the adhesive resin sheet placed thereon, for explaining another representative step of the modification of the production process shown in FIGS. 3A to 3H.
Figure 4C:
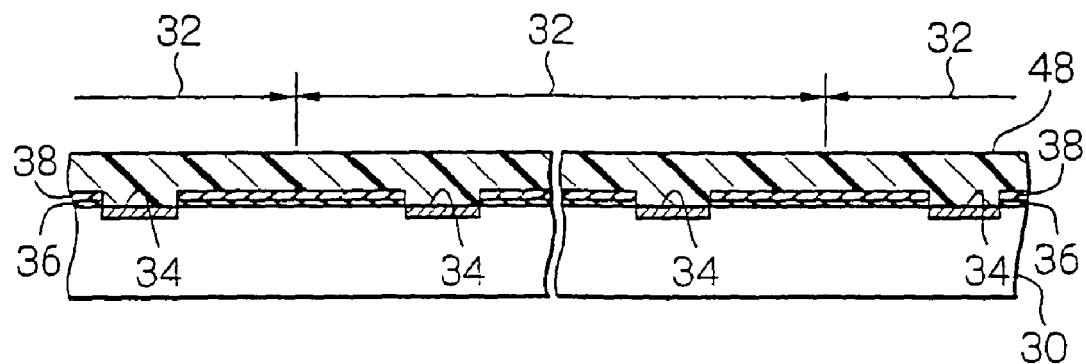
FIG. 4C is a partially enlarged sectional view of the silicon wafer shown in FIG. 4B.

With reference to FIGS. 4A, 4B and 4C, a modification of the above-mentioned first embodiment of the production process according to the present invention is explained next. Note, in FIGS. 4A, 4B and 4C, the same references as in FIGS. 153A to 3H represent the same features.

In this modification, as shown in FIG. 4A, an adhesive resin sheet ARS is prepared while preparing the silicon wafer 30. Then, as shown in FIG. 4B, the adhesive resin sheet ARS is placed on the top surface of the silicon wafer 30, and is subjected to a laminating process by using, for example, a diaphragm type vacuum laminating machine, which is available from MEIKI SEISHAKUSHO K.K. Thus, the adhesive resin sheet ARS is formed as a sealing resin layer 48 on the top surface of the silicon wafer 30, such that the electrode terminals or conductive pads 34 and the passivation layer 38 are completely covered with the sealing resin layer 48, as shown in FIG. 4C. Thereafter, the silicon wafer 30 having the sealing resin layer 48 is processed as explained with reference to FIGS. 3F to 3H, resulting in production of the flip-chip type semiconductor devices (32').

Similar to the above-mentioned first embodiment of the production process according to the present invention, in this modification, it is possible to accurately control a thickness of the adhesive resin sheet ARS, and therefore, an amount of resin material forming the sealing resin layer 48.

For example, the flip-chip type semiconductor device 32' according to the present invention may be used to manufacture a chip-on-chip semiconductor package.

With reference to FIGS. 5A to 5D, a production process for manufacturing the chip-on-chip semiconductor package, using the flip-chip type semiconductor device 32' according to the present invention, is explained next.

Figure 5A:
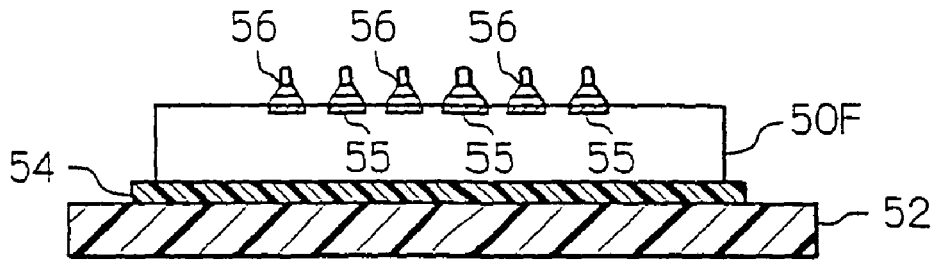
FIG. 5A is a sectional view of a first semiconductor device mounted on a substrate, for explaining a first representative step of a production process for manufacturing a chip-on-chip semiconductor package, using the flip-chip type semiconductor device according to the present invention.

As shown in FIG. 5A, a first semiconductor device 50F is prepared, and then is mounted on and adhered to a substrate 52, using a suitable adhesive agent 54. The first semiconductor device 50F has a plurality of conductive pads 55 provided on a top surface thereof, and each of the conductive pads 55 may be formed of a suitable metal material, such as aluminum, gold, copper or the like. Although not illustrated, a silicon dioxide layer and a passivation layer may be formed on the top surface of the first semiconductor device 50F such that each of the conductive pads 55 is exposed to the outside. Also, an organic protective layer, such as a polyimide layer, may be substituted for both the silicon dioxide layer and the passivation layer.

Note, in this embodiment, although the substrate 52 is formed as a wiring board or an interposer, it may comprise a mount stage included in a metal lead frame.

As shown in FIG. 5A, the first semiconductor device 50F also has a plurality of metal bumps 56 bonded on the conductive pads 55 which are arranged at a central area of the top surface thereof. Preferably, each of the metal bumps 56 is formed as a sprout-like gold bump, which may be may be produced from a gold wire, using a well-known wire-bonding machine.

In particular, as well known, the wire-bonding machine has a movable capillary tube, through which a fine gold wire passes. A leading or free end of the gold wire, which is protruded from a tip of the capillary tube, terminates at a fine small bead, by which a withdrawal of the gold wire into the capillary tube is prevented. Also, the capillary tube is provided with a needle-like electrode, which is called a torch, and the needle-like electrode is beside the tip of the capillary tube.

For the formation of a sprout-like bump 56, the movable capillary tube is moved such that the small bead is pressed against a conductive pad 55 while being subjected to ultrasonic vibration, and the small bead is welded and bonded to the conductive pad 55 concerned, due to both the ultrasonic vibration and the pressure. Then, while the capillary tube is moved upward so as to draw the gold wire out of the capillary tube, a high voltage is applied to the needle-like electrode to produce a spark between the drawn gold wire and the needle-like electrode.

Thus, the fine gold wire is cut off by the spark, resulting in a formation of a sprout-like bump 56. Namely, the bonded small bead is left as the sprout-like bump 56 on the conductive pad 55 concerned. On the other hand, the cut-off end of the gold wire is fused due to the spark to thereby produce a fine small bead which is used for a next formation of a sprout-like bump 56.

In short, in the first semiconductor device 50F, each of the sprout-like bumps 56 is associated with a corresponding conductive pad 55 to thereby define an electrode terminal.

Figure 5B:
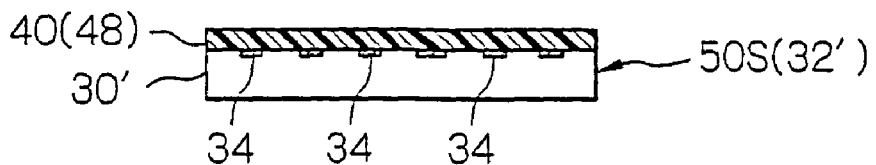
FIG. 5B is a sectional view of a second semiconductor device produced as the flip-chip type semiconductor device according to the present invention, for explaining a second representative step of the production process for manufacturing the chip-on-chip semiconductor package.

On the other hand, as shown in FIG. 5B, a flip-chip type semiconductor device (32'), which is manufactured in accordance with the first embodiment of the production process according to the present invention, is prepared as a second semiconductor device 50S featuring a smaller size than that of the first semiconductor device 50F. Note, in FIG. 5B, both a silicon dioxide layer 36 and a passivation layer 38 are omitted to avoid complexity of illustration. Also, note that the arrangement of the sprout-like metal bumps 56 of the first semiconductor device 50F has a mirror image relationship with respect to the arrangement of the conductive pads 34 of the second semiconductor device 50S.

Figure 5C:
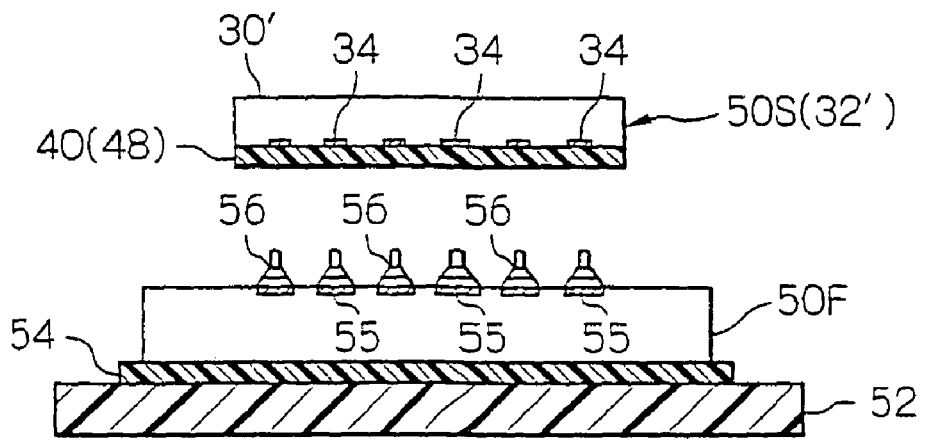
FIG. 5C is a sectional view of the first and second semiconductor devices aligned with each other, for explaining a third representative step of the production process for manufacturing the chip-on-chip semiconductor package.

After the preparation of the first and second semiconductor devices 50F and 50S, as shown in FIG. 5C, the second semiconductor device 50S is flipped over and positioned above the first semiconductor device 50F such that the respective conductive pads 34 of the second semiconductor device 50S are aligned with the sprout-like metal bumps 56 provided on the central area of the top surface of the first semiconductor device 50F.

Figure 5D:
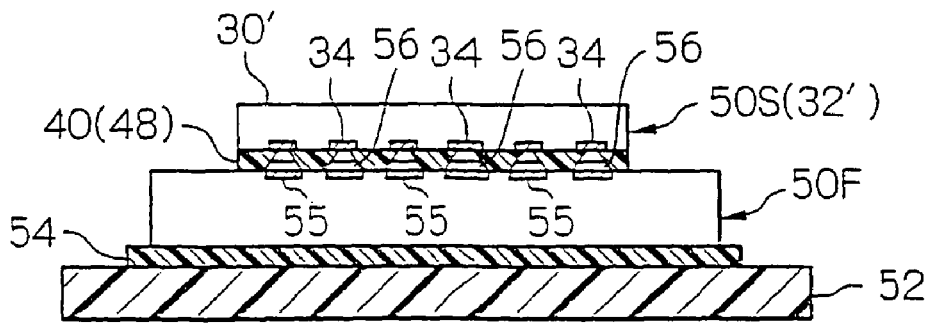
FIG. 5D is a sectional view of an assembly of the first and second semiconductor devices, for explaining a fourth representative step of the production process for manufacturing the chip-on-chip semiconductor package.

Subsequently, as shown in FIG. 5D, the second semiconductor device 50S is pressed against the top surface of the first semiconductor device 50F, using either an ultrasonic-pressure bonding method or a heat-pressure bonding method, so that the respective conductive pads 34 of the second semiconductor device 50S are abutted against and bonded to the sprout-like metal bumps 56 provided on the central area of the top surface of the first semiconductor device 50F. Namely, each of the sprout-like metal bumps 56 is penetrated into the sealing resin layer (40 or 48), and a tip end of the sprout-like metal bump 56 concerned is squashed on and bonded to a corresponding conductive pad 34. Then, the sealing resin layer (40 or 48) is completely hardened whereby the sprout-like metal bumps 56 are resin-sealed together with the conductive pads 34 and 55 associated therewith.

Thereafter, each of the conductive pads (not shown), which are provided at the peripheral area of the top surface of the first semiconductor device 50F, is electrically connected to a corresponding conductive pad (not shown), provided on the interposer 52, with a bonding wire. Then, the assembly shown in FIG. 5D is resin-sealed, using a transfer molding method, resulting in production of the chip-on-chip semiconductor package.

In the above-mentioned formation process of the sprout-like bumps 56, it is very difficult or impossible to arrange the sprout-like bumps 56 at a pitch of smaller than 40 µm, and thus the conductive pads 34 of the second semiconductor device 50S must be arranged at the pitch of 40 µm or more than 40 µm, as stated above.

When the respective sprout-like metal bump 56 are bonded to the conductive pads 34, there may be a case where a very small part of the resin material forming the sealing resin layer (40 or 48) is left therebetween. However, if the resin material forming the sealing resin layer (40 or 48) is selected so as to exhibit a viscosity of less than 1,000 Pa·s at a bonding temperature for bonding the sprout-like metal bumps 56 to the conductive pads 34, it is possible to substantially remove the resin material from the bonding faces therebetween.

Before the second semiconductor device 20S can be accurately positioned above the first semiconductor device 20F, a thickness of 35 µm should be preferably given as a maximum thickness to the sealing resin layer (40 or 48). In particular, the second semiconductor device 20S has a positioning mark covered with the sealing resin layer (40 or 48), and the position of the second semiconductor device 20S to the first semiconductor device 20F is carried out by detecting the positioning mark with a positioning camera. Therefore, preferably, the sealing resin layer (40 or 48) should have the thickness of smaller than 35 before the positioning mark can be precisely detected by the positioning camera.

Figure 6:
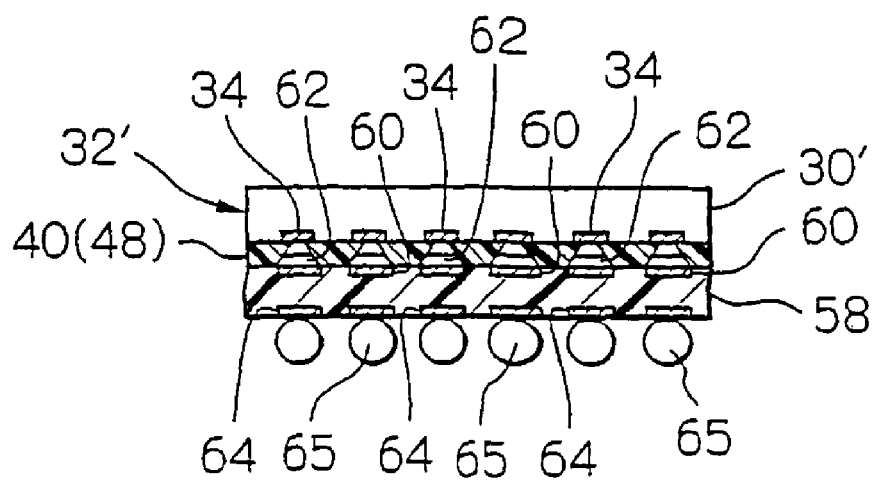
FIG. 6 is a sectional view of a BGA (ball grid array) type semiconductor package using the flip-chip type semiconductor device according to the present invention.

As shown in FIG. 6, the flip-chip type semiconductor device 32' according to the present invention may be used to manufacture a BGA (ball grid array) type semiconductor package.

In particular, in manufacturing the BGA type semiconductor package, a package board or interposer 58 is prepared. The interposer 58 has a plurality of conductive pads 60 arranged on a top surface thereof, and respective sprout-like metal bumps 62 formed on the conductive pads 60. Each of the sprout-like metal bumps 62 is produced in substantially the same manner as mentioned above, and the arrangement of the sprout-like metal bumps 62 has a mirror image relationship with respect to the arrangement of the conductive pads 34 of the flip-chip type semiconductor device 32'. In short, each of the sprout-like bumps 62 is associated with a corresponding conductive pad 66 to thereby define an electrode terminal.

Also, the interposer 58 a plurality of conductive pads 64 arranged on a bottom surface thereof, and respective solder balls 65 bonded to the conductive pads 64, with the solder balls 65 forming the ball grid array (BGA). The flip-chip type semiconductor device 32' is mounted on the interposer 58 in substantially the same manner as explained with reference to FIGS. 5C and 5D.

Figure 7:
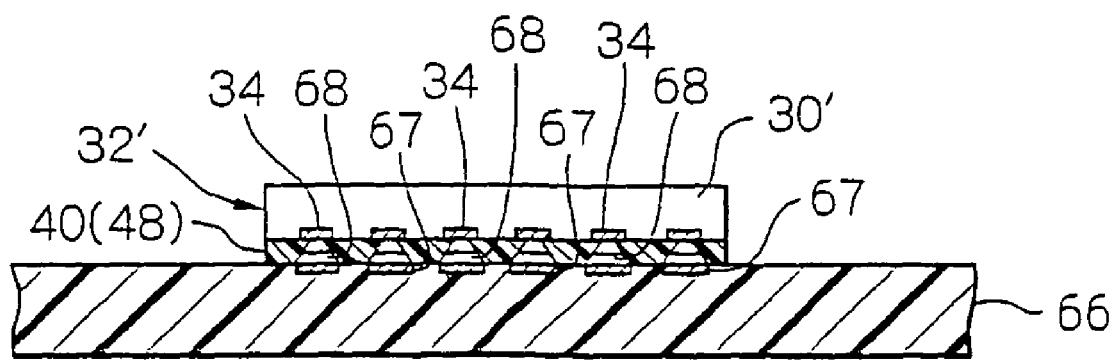
FIG. 7 is a sectional view of a motherboard on which the flip-type semiconductor device according to the present invention is directly mounted.

Further, as shown in FIG. 7, the flip-chip type semiconductor device 32' according to the present invention may be directly mounted on a motherboard 66.

In particular, the motherboard 66 has a plurality of conductive pads 67 arranged on a top surface thereof, and respective sprout-like metal bumps 68 formed on the conductive pads 67. Each of the sprout-like metal bumps 68 is produced in substantially the same manner as mentioned above, and the arrangement of the sprout shaped metal bumps 68 has a mirror image relationship with respect to the arrangement of the conductive pads 34 of the flip-chip type semiconductor device 32'. In short, each of the sprout-like bumps 68 is associated with a corresponding conductive pad 67 to thereby define an electrode terminal. The flip-chip type semiconductor device 32' is mounted on the motherboard 68 in substantially the same manner as explained with reference to FIGS. 5C and 5D.

As is apparent from the foregoing, in any case, by using a flip-chip type semiconductor 32' according to the present invention, it is possible to carry out an underfilling process or resin-sealing process at the same time when the flip-chip type semiconductor device 32' is on another semiconductor device (50F), an interposer (58) or a motherboard (66). In other words, according to the present invention, it is possible to substantially omit the underfilling process or resin-sealing process after the mounting of the flip-chip type semiconductor device 32'.

Also, according to the present invention, since it is possible to accurately control the amount of resin material forming the sealing resin layer 40, a swelling-out of the sealing resin layer (40 or 48) or a production of voids or cavities in the sealing resin layer (40 or 48) can be prevented, resulting in an increase in productivity of electronic products, such as chip-on-chip semiconductor packages, BGA type semiconductor packages or motherboards.

Second Embodiment

With reference to FIGS. 8A to 8D, a second embodiment of a production process for manufacturing a plurality of flip-chip type semiconductor devices according to the present invention is explained below.

First, as shown in FIG. 8A, a silicon wafer 70 is prepared. Similar to the above-mentioned first embodiment, a top surface of the silicon wafer 70 is sectioned into a plurality of semiconductor chip areas by forming grid-like fine grooves (i.e. scribe lines). Note, in FIG. 8A, an extent of each of the semiconductor chip areas is indicated by reference 72. The silicon wafer 70 is already processed by various well-known methods so that each of the semiconductor chip areas 72 is produced as a semiconductor chip or device.

Also, a plurality of conductive pads 73 are already provided and arranged on each of the semiconductor devices 72. Although not illustrated, a silicon dioxide layer and a passivation layer may be formed on the top surface of the silicon wafer 70 such that each of the conductive pads 73 is exposed to the outside. An organic protective layer, such as a polyimide layer may be substituted for both the silicon dioxide layer and the passivation layer.

Note, each of the conductive pads 73 is formed of a suitable metal material, such as aluminum, gold, copper or the like. Also, note that, in this embodiment, the conductive pads 73 may be arranged at a pitch of 50 μm or smaller than 50 μm.

Further, as shown in FIG. 8A, a plurality of stud-like metal bumps 74 are already formed on the respective conductive pads 73. Preferably, the stud-like metal bumps 74 are made from gold, but a suitable solder material may be used for the stud-like metal bumps 74. The formation of the stud-like metal bumps 74 on the conductive pads 73 may be carried out, using, for example, a photolithography process and an electroplating process.

In short, in each of the semiconductor devices 72 each of the stud-like bumps 74 is associated with a corresponding conductive pad 73 to thereby define an electrode terminal.

While preparing the silicon wafer 70, as shown in FIG. 8B, a sealing resin layer 75 is formed on the silicon wafer 70 in substantially the same manner as the above-mentioned first embodiment. Namely, the formation of the sealing resin layer 75 may be carried out by either a spin-coat process as shown in FIGS. 3C, 3D and 3E or a laminating process as shown in FIGS. 4A, 4B and 4C. In any event, the conductive pads 73 and the stud-like metal bumps 74 are completely covered with the sealing resin layer 75, as shown in FIG. 8B.

After the formation of the sealing resin layer 75, as shown in FIG. 8C, a dicing resin sheet 76 having an adhesive layer 77 is applied and adhered to a bottom surface of the silicon wafer 70. Then, as shown in FIG. 8D, the silicon wafer 70 is subjected to a dicing process so as to be cut off along the grid-like grooves (not shown), with three cutting grooves being representatively indicated by reference 78 in FIG. 8D. Namely, the silicon wafer 70 is divided into the plurality of flip-chip type semiconductor devices 72A, with each of the divided sections of the silicon wafer 70 itself forming a semiconductor substrate 70' for a corresponding flip-chip type semiconductor device 72A.

Similar to the above-mentioned silicon wafer 30 or the divided semiconductor devices 32', the processed silicon wafer 70 or the divided semiconductor devices 72A may be shipped and circulated in an electronic market, to manufacture compact semiconductor packages, such as such as BGA (ball grid array) type semiconductor packages, chip-on-chip type semiconductor packages or the like.

With reference to FIGS. 9A to 9D, a production process for manufacturing the chip-on-chip semiconductor package, using the flip-chip type semiconductor device 72A according to the present invention, is explain next.

Figure 9A:
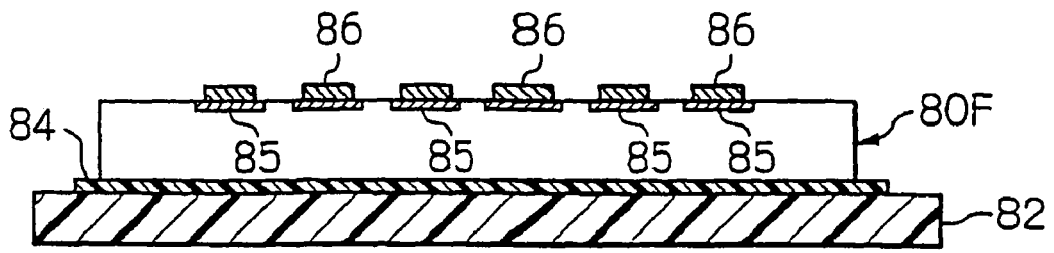
FIG. 9A is a sectional view of a first semiconductor device mounted on a substrate, for explaining a first representative step of another production process for manufacturing a chip-on-chip semiconductor package, using the flip-chip type semiconductor manufactured by the second embodiment of the production process according to the present invention.

As shown in FIG. 9A, a first semiconductor device 80F is prepared, and then is mounted on and adhered to a substrate 82, using a suitable adhesive agent 84. The first semiconductor device 80F has a plurality of conductive pads 85 provided on a top surface thereof, and each of the conductive pads 85 may be formed of a suitable metal material, such as aluminum, gold, copper or the like. Although not illustrated, a silicon dioxide layer and a passivation layer may be formed on the top surface of the first semiconductor device 80F such that each of the conductive pads 85 is exposed to the outside. An organic protective layer, such as a polyimide layer may be substituted for both the silicon dioxide layer and the passivation layer.

Note, in this embodiment, although the substrate 82 is formed as a wiring board or an interposer, it may comprise a mount stage included in a metal lead frame.

As shown in FIG. 9A, the first semiconductor device 80F also has a plurality of stud-like metal bumps 86 formed on the conductive pads 85 which are arranged at a central area of the top surface thereof. Similar to the above-mentioned stud-like metal bumps 74, preferably, the stud-like metal bumps 86 are made from gold, but a suitable solder material may be used for the stud-like metal bumps 86. Also, the formation of the stud-like metal bumps 86 on the conductive pads 85 may be carried out in substantially the same manner as the above-mentioned stud-like bumps 74.

In short, in the first semiconductor device 80F, each of the stud-like bumps 86 is associated with a corresponding conductive pad 85 to thereby define an electrode terminal.

Figure 9B:
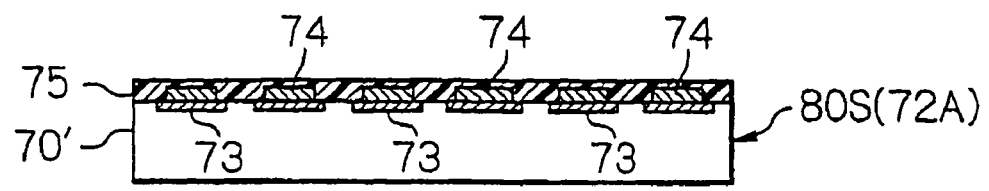
FIG. 9B is a sectional view of a second semiconductor device produced as the flip-chip type semiconductor device manufactured by the second embodiment of the production process according to the present invention, for explaining a second representative step of the production process for manufacturing the chip-on-chip semiconductor package.

On the other hand, as shown in FIG. 9B, a flip-chip type semiconductor device (72A), which is manufactured by the second embodiment of the production process according to the present invention, is prepared as a second semiconductor device 80S featuring a smaller size than that of the first semiconductor device 80F. Note, the arrangement of the stud-like metal bumps 86 of the first semiconductor device 80F has a mirror image relationship with respect to the arrangement of the stud-like metal bumps 74 of the second semiconductor device 80S.

Figure 9C:
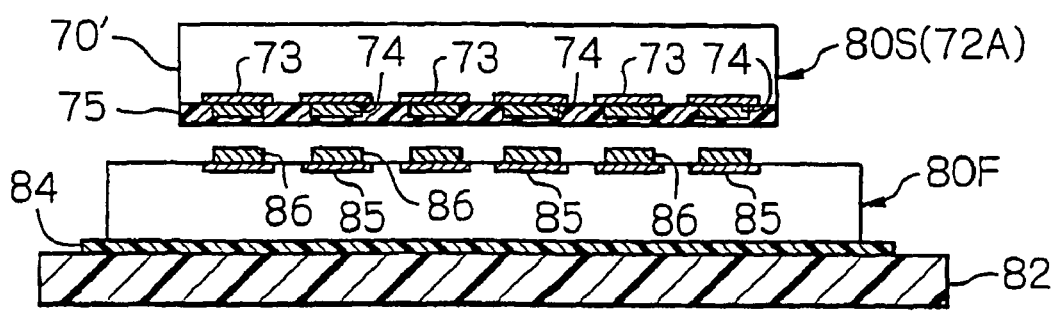
FIG. 9C is a sectional view of the first and second semiconductor devices aligned with each other, for explaining a third representative step of the production process for manufacturing the chip-on-chip semiconductor package.

After the preparation of the first and second semiconductor devices 80F and 80S, as shown in FIG. 9C, the second semiconductor device 80S is flipped over and positioned above the first semiconductor device 80F such that the respective stud-like metal bumps 74 of the second semiconductor device 80S are aligned with the stud-like metal bumps 86 provided on the central area of the top surface of the first semiconductor device 80F.

Figure 9D:
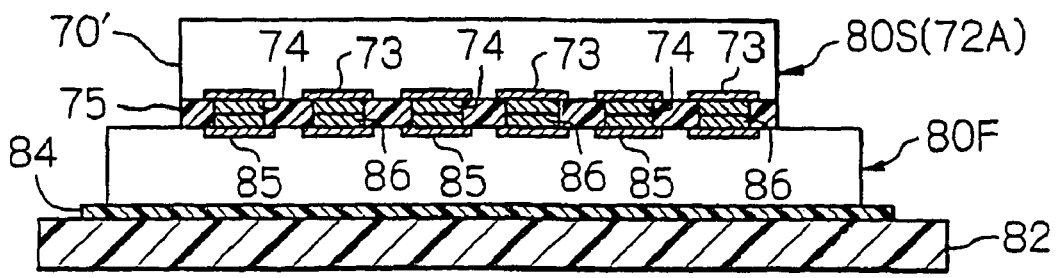
FIG. 9D is a sectional view of an assembly of the first and second semiconductor devices, for explaining a fourth representative step of the production process for manufacturing the chip-on-chip semiconductor package.

Subsequently, as shown in FIG. 9D, the second semiconductor device 80S is pressed against the top surface of the first semiconductor device 80F, using either an ultrasonic-pressure bonding method or a heat-pressure bonding method, so that the respective stud-like metal bumps 74 of the second semiconductor device 80S are abutted against and bonded to the stud-like metal bumps 86 provided on the central area of the top surface of the first semiconductor device 80F. Namely, each of the stud-like metal bumps 86 is penetrated into the sealing resin layer 75, and is then bonded to a corresponding stud-like metal bump 74. Then, the sealing resin layer 75 is completely hardened whereby the stud-like metal bumps 74 and 76 are resin-sealed together with the conductive pads 73 and 85 associated therewith.

Thereafter, each of the conductive pads (not shown), which are provided at the peripheral area of the top surface of the first semiconductor device 80F, is electrically connected to a corresponding conductive pad (not shown), provided on the interposer 82, with a bonding wire. Then, the assembly shown in FIG. 9D is resin-sealed, using a transfer molding method, resulting in production of the chip-on-chip semiconductor package.

Similar to the above-mentioned flip-chip type semiconductor device 32', the flip-chip type semiconductor device 72A also may be used to manufacture a BGA (ball grid array) type semiconductor package. Further, the flip-chip type semiconductor device 72A may be directly mounted on a motherboard.

Also, similar to the above-mentioned flip-chip type semiconductor device 32', by using a flip-chip type semiconductor device 72A according to the present invention, it is possible to carry out an underfilling process or resin-sealing process at the same time when the flip-chip type semiconductor device 72A is mounted on another semiconductor device, an interposer or a motherboard. In other words, according to the present invention, it is possible to substantially omit the underfilling process or resin-sealing process after the mounting of the flip-chip type semiconductor device 72A.

Further, similar to the above-mentioned flip-chip type semiconductor device 32', since it is possible to accurately control the amount of resin material forming the sealing resin layer 75, a swelling-out of the sealing resin layer 75 or a production of voids or cavities in the sealing resin layer 75 can be prevented, resulting in an increase in productivity of electronic products, such as chip-on-chip semiconductor packages, BGA type semiconductor packages or motherboards.

Similar to the above-mentioned first embodiment, in the second embodiment, the resin material forming the sealing resin layer 75 should be selected so as to exhibit a viscosity of less than 1,000 Pa·s at a bonding temperature for bonding the stud-like metal bumps 74 to the stud-like metal bumps 86, so that the resin material forming the sealing resin layer 75 can be substantially removed from the bonding faces therebetween.

Also, similar to the above-mentioned first embodiment, a thickness of 35 μm should be preferably given as a maximum thickness to the sealing resin layer 75, so that a positioning mark on the second semiconductor device 80S can be precisely detected by a positioning camera, which is used to position the second semiconductor device 80S above the first semiconductor device 80F.

Figure 10A:
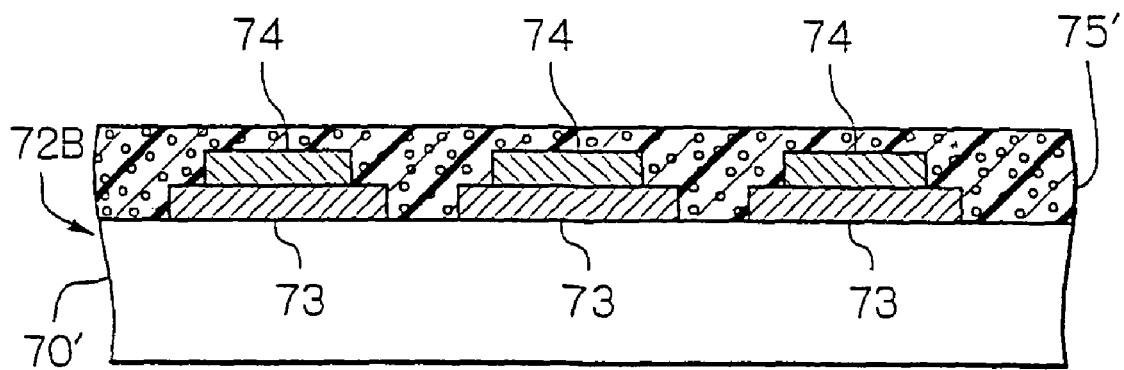
FIG. 10A is an enlarged sectional view of a modification of the flip-chip type semiconductor device manufactured by the second embodiment of the production process according to the present invention.

With respect to FIG. 10A, a modification of the flip-chip type semiconductor device 72A, manufactured by the second embodiment of the production process according to the present invention, is illustrated. Note, in FIG. 10A, the modified flip-chip type semiconductor device is generally indicated by reference 72B, and the same references as in FIGS. 8A to 8D represent the same features.

In the modified flip-chip type semiconductor device 72B, a sealing resin layer 75', containing a filler comprising a plurality of conductive solid particles 88 having an average diameter of smaller than 10 μm, is substituted for the sealing resin layer 75. The sealing resin layer 75' may be obtained by laminating an anisotropic conductive film (ACF) on the top surface of the silicon wafer 70. Note, the anisotropic conductive film is available from a market as a resin film containing a plurality of conductive solid particles. Also, the sealing resin layer 75' may be obtained by spin-coating the top surface of the silicon wafer 70 with an uncured liquid resin material containing the conductive filler (88).

Figure 10B:
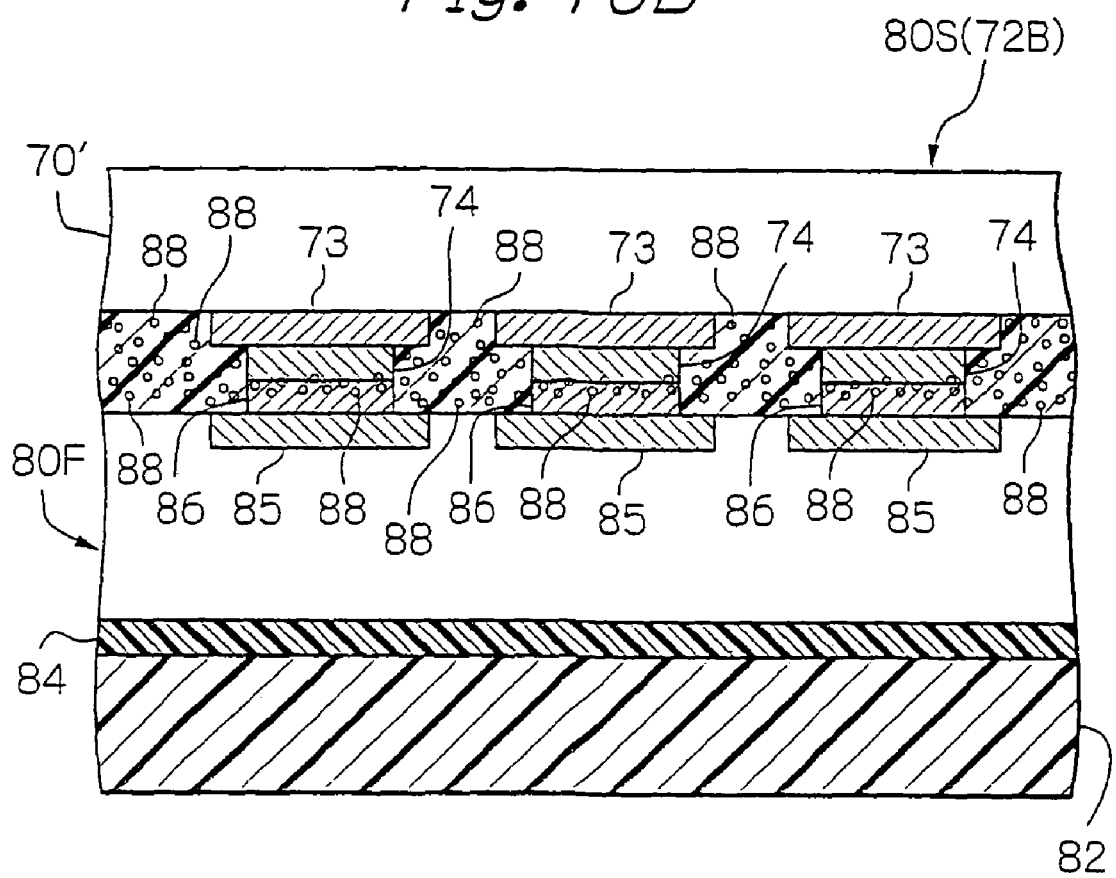
FIG. 10B is an enlarged sectional view of a chip-on-chip semiconductor device using the modification of the flip-chip type semiconductor device shown in FIG. 10A.

As shown in FIG. 10B, the modified flip-chip type semiconductor device 72B may be also used to manufacture a chip-on-chip semiconductor package. In particular, the chip-on-chip semiconductor package is manufactured by mounting the modified flip-chip type semiconductor device 72B as a second semiconductor device 80S on the first semiconductor device 10F shown in FIG. 9A, in substantially the same manner as explained with respect to the FIGS. 9C and 9D.

As is apparent from FIG. 10B, when each of the stud-like bumps 74 of the second semiconductor device (80S or 72B) is pressed against and bonded to a corresponding stud-like bump 86 of the first semiconductor device 80F, a small part of the filler or conductive solid particles 88 is pinched in the bonding face therebetween, so that the oxide skins of both the stud-like bumps 74 and 86 are broken by the pinched solid particles 88, resulting in establishment of a good electrical connection between both the stud-like bumps 74 and 86.

In this modified flip-chip type semiconductor device 72B, although the sealing resin layer 75' contains the conductive filler (88), a nonconductive filler, which is composed of ceramic particles or hard resin particles, may be substituted for the conductive filler (88).

Third Embodiment

With reference to FIGS. 11A to 11D, a third embodiment of a production process for manufacturing a plurality of flip-chip type semiconductor devices according to the present invention is explained below.

Figure 11A:
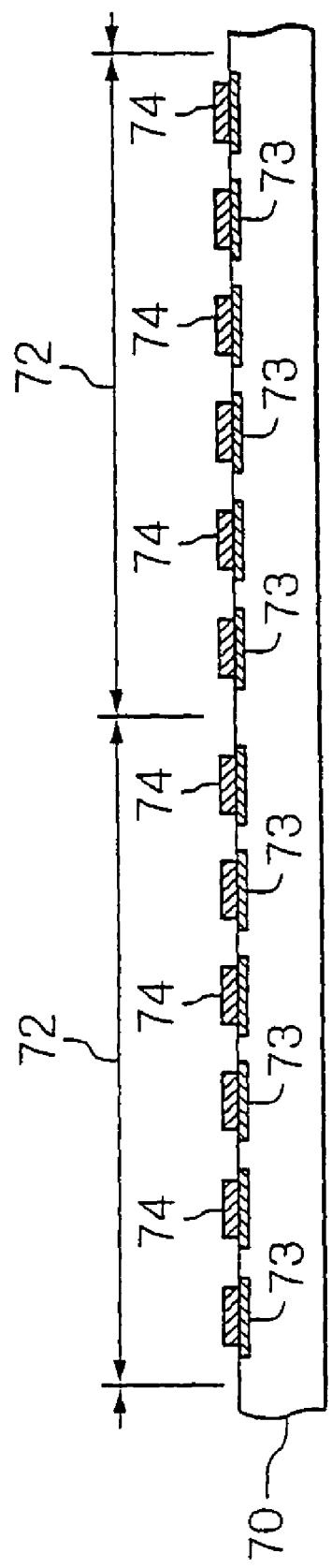
FIG. 11A is a partial sectional view of a silicon wafer, for explaining a first representative step of a third embodiment of a production process for manufacturing flip-chip type semiconductor devices according to the present invention.

First, as shown in FIG. 11A, a silicon wafer, which is identical to that used in the above-mentioned second embodiment, is prepared. Note, in FIG. 11A, the same references as in FIG. 8A represent the same features.

Figure 11B:
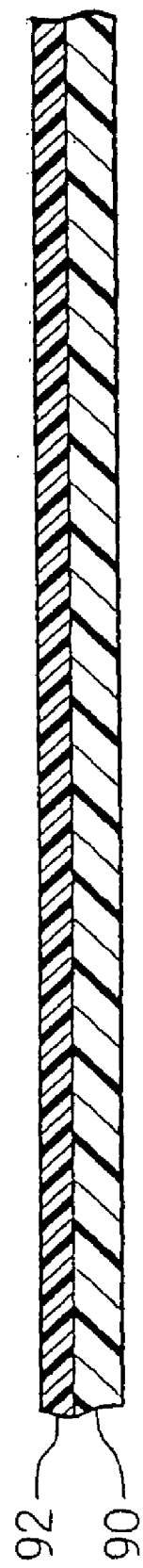
FIG. 11B is a partial sectional view of a dicing resin sheet, on which a sealing resin layer is laminated, for explaining a second representative step of the third embodiment of the production process for manufacturing the flip-chip type semiconductor devices according to the present invention.

While preparing the silicon wafer 70, as shown in FIG. 11B, a dicing resin sheet 90, having an adhesive resin sheet 92 laminated thereon, is prepared.

After the preparation of the silicon wafer 70 and the dicing resin sheet 90 carrying the adhesive resin sheet 92, as shown in FIG. 11C, the silicon wafer 70 is faced down and applied to the adhesive resin sheet 92 of the dicing resin sheet 90, whereby the adhesive resin sheet 92 is formed as a sealing resin layer on the top surface of the silicon wafer 70, such that the conductive pads 73 and the stud-like metal bumps 74 are completely covered with the sealing resin layer 92, as shown in FIG. 11C.

Thereafter, as shown in FIG. 11D, the silicon wafer 70 is subjected to a dicing process so as to be cut off along the grid-like grooves (not shown), with three cutting grooves being representatively indicated by reference 94. Namely, the silicon wafer 70 is divided into the plurality of flip-chip type semiconductor devices 72C, with each of the divided sections of the silicon wafer 70 itself forming a semiconductor substrate 70' for a corresponding flip-chip type semiconductor device 72C.

Similar to the above-mentioned cases, the processed silicon wafer 70 or the divided flip-chip type semiconductor devices 72C may be shipped and circulated in an electronic market, to manufacture compact semiconductor packages, such as such as BGA (ball grid array) type semiconductor packages, chip-on-chip type semiconductor packages or the like.

In the third embodiment, since it is possible to accurately control a thickness of the adhesive resin sheet or sealing resin layer 92, and therefore, an amount of resin material forming the sealing resin layer 92, a swelling-out of the sealing resin layer 92 or a production of voids or cavities in the sealing resin layer 92 can be prevented, resulting in an increase in productivity of electronic products, such as chip-on-chip semiconductor packages, BGA type semiconductor packages or motherboards.

Also, in the third embodiment, the sealing resin layer 92 may contain a filler comprising a plurality of conductive or nonconductive particles, as explained with reference to FIGS. 10A and 10B.

Figure 12A:
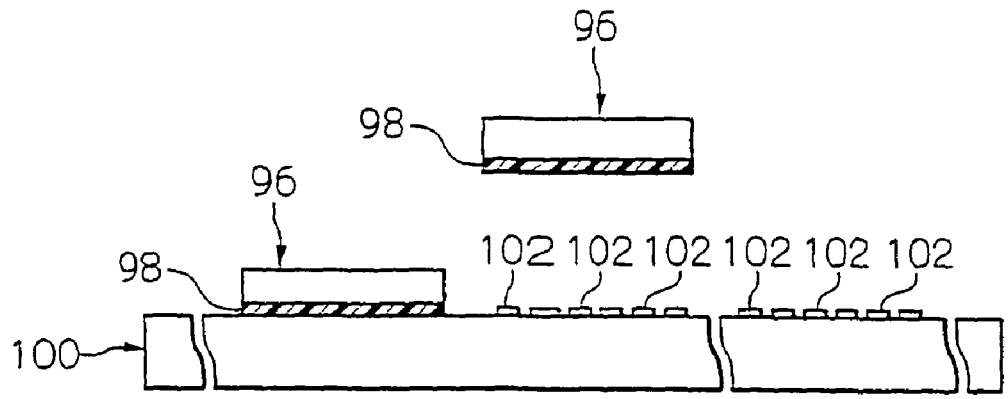
FIG. 12A is a schematic sectional view of a silicon wafer, for explaining a first representative step of yet another production process for manufacturing a chip-on-chip semiconductor package, using the flip-chip type semiconductor device manufactured in accordance with the present invention.
Figure 12B:
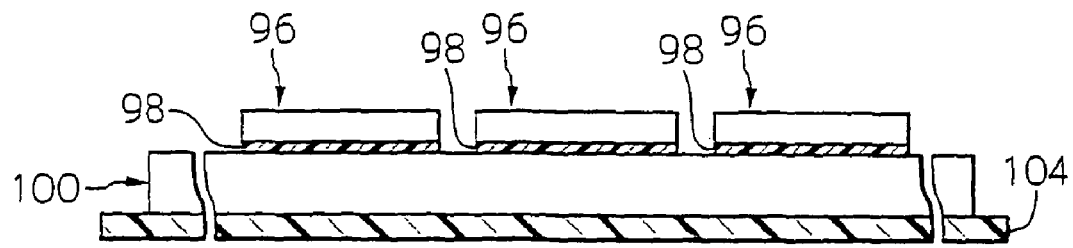
FIG. 12B is a schematic sectional view of the silicon wafer on which the flip-chip type semiconductor devices are mounted thereon, for explaining a second representative step of the production process for manufacturing the chip-on-chip semiconductor package.
Figure 12C:
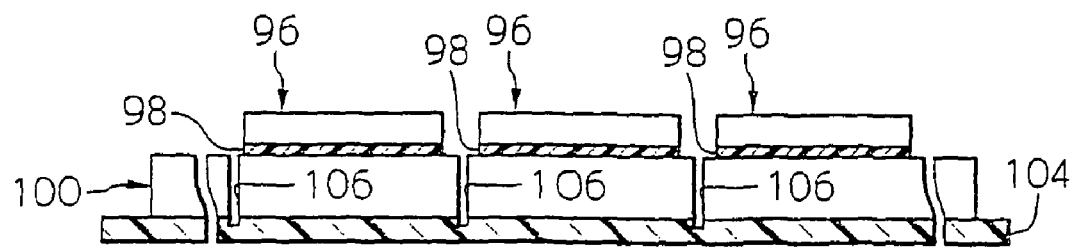
FIG. 12C is a schematic sectional view of the silicon wafer subjected to a dicing process, for explaining a third representative step of the production process for manufacturing the chip-on-chip semiconductor package.

In the above-mentioned production processes in which a chip-on-chip semiconductor package is manufactured, using a flip-chip type semiconductor device according to the present invention, although the flip-chip type semiconductor device is mounted on another separated semiconductor device, it may be mounted on a semiconductor device which is produced in a silicon wafer, as schematically illustrated in FIGS. 12A, 12B and 12C.

In particular, in FIG. 12A, reference 96 indicates the flip-chip type semiconductor devices, which are manufactured by either the second embodiment or the third embodiment of the production process according to the present invention, and each of the semiconductor devices 96 has a sealing resin layer 98 formed on a top surface thereof. Although not illustrated in FIG. 12A, of course, each of the semiconductor devices 96 has a plurality of electrode terminals provided and arranged on the top surface thereof. Each of these electrode terminals comprises a conductive pad formed on the top surface of each of the semiconductor devices, and a stud-like metal bump bonded on the conductive pad, and the conductive pads and the stud-like metal bumps are covered with the sealing resin layer 98.

On the other hand, reference 100 indicates a silicon wafer having a plurality of semiconductor devices produced therein, and each of the semiconductor devices has a plurality of electrode terminals, each of which comprises a conductive pad (not shown) formed a top surface of each of the semiconductor device, and a stud-like metal bump 102 bonded on the conductive pad. Of course, the arrangement of the stud-like metal bumps 102 of each of the semiconductor devices on the silicon wafer 100 has a mirror image relationship with respect to the arrangement of the stud-like metal bumps (not shown) of each of the flip-chip type semiconductor devices 96:

As shown representatively shown in FIG. 12A, each of the flip-chip type semiconductor devices 96 is flipped over and positioned above one of the semiconductor devices on the silicon wafer 100, so that the stud-like metal bumps of the flip-chip type semiconductor device 96 is aligned with the stud-like metal bump of the corresponding semiconductor device on the silicon wafer 100. Then, the flip-chip type semiconductor 96 concerned is pressed against to the corresponding semiconductor device, using either an ultrasonic-pressure bonding method or a heat-pressure bonding method, so that the stud-like metal bumps of the flip-chip type semiconductor device 96 are bonded to the respective stud-like metal bumps 102 of the corresponding semiconductor device, resulting in production of a plurality of chip-on-chip semiconductor assemblies on the silicon wafer 100.

After the flip-chip type semiconductor devices 96 are mounted on all the semiconductor devices on the silicon wafer 100, i.e. after the production of the chip-on-chip assemblies is completed on the silicon wafer 100, as shown in FIG. 12B, a dicing resin sheet 104 is adhered to a bottom surface of the silicon wafer 100, using a suitable adhesive agent. Then, as shown in FIG. 12C, the silicon wafer 100 is subjected to a dicing process is subjected to a dicing process so as to be cut off along the grid-like grooves (not shown), with three cutting grooves being representatively indicated by reference 106 in FIG. 12C. Namely, the chip-on-chip assemblies are separated from each other. Thereafter, each of the separated chip-on-chip assemblies is resin-sealed, using a transfer molding method, resulting in production of the chip-on-chip semiconductor package.

Especially, when a flip-chip type semiconductor device according to the present invention features a relatively small size, i.e. when the conductive pads of the flip-chip semiconductor device are arranged at the pitch of smaller than 50 µm, the production process for the chip-on-chip semiconductor package, as shown in FIGS. 12A, 12B and 12C, is preferable in that the flip-chip type semiconductor device can be more easily positioned in parallel with a top surface of a silicon wafer (100) in comparison with the case where the flip-chip type semiconductor device is positioned in parallel with a top surface of a separated semiconductor device, as shown in, for example, FIG. 9C.

Of course, the production process for the chip-on-chip semiconductor package, as shown in FIGS. 12A, 12B and 12C, is applicable to production of a chip-on-chip semiconductor device using a flip-chip type semiconductor device (32') featuring a relatively large size, as shown in FIG. 5B, in which the conductive pads are arranged at the pitch of 40 µm or more than 40 µm.

Finally, it will be understood by those skilled in the art that the foregoing description is of preferred embodiments of the devices and processes, and that various changes and modifications may be made to the present invention without departing from the spirit and scope thereof.

The invention claimed is:

1. An electronic apparatus, comprising:
   a first semiconductor device having first electrode terminals; and
   a second semiconductor device having second electrode terminals of solder material and mounted by using a sealing resin layer containing a filler on said first semiconductor device, so that said first electrode terminals and said second electrode terminals penetrate said sealing resin layer to seal a space between said first semiconductor device and said second semiconductor device by said sealing resin layer,
   a part of said sealing resin layer being pinched in bonding faces between said first electrode terminals and respective ones of said second electrode terminals, a part of said filler breaking into the solder material of said second electrode terminals.

2. The electronic apparatus as set forth in claim 1, wherein said filler is conductive.

3. The electronic apparatus as set forth in claim 1, wherein said filler is nonconductive.

4. The electronic apparatus as set forth in claim 2, wherein said filler comprises a plurality of conductive solid particles.

5. The electronic apparatus as set forth in claim 3, wherein said filler comprises a plurality of hard resin particles.

6. The electronic apparatus as set forth in claim 1, wherein said first electrode terminals are metal bumps.

7. The electronic apparatus as set forth in claim 6, wherein said metal bumps are made of gold.

8. The electronic apparatus as set forth in claim 1, wherein the filler of said second sealing resin layer breaks through oxide skins on said first and second electrode terminals.

* * * * *